United States Patent
Tanigawa et al.

(10) Patent No.: US 8,086,108 B2
(45) Date of Patent: Dec. 27, 2011

(54) OPTICAL TRANSMISSION/RECEPTION DEVICE AND OPTICAL COMMUNICATION SYSTEM USING THE SAME

(75) Inventors: Tatsuya Tanigawa, Osaka (JP); Tetsuzo Ueda, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 680 days.

(21) Appl. No.: 12/180,094

(22) Filed: Jul. 25, 2008

(65) Prior Publication Data

US 2009/0028563 A1  Jan. 29, 2009

(30) Foreign Application Priority Data

Jul. 25, 2007 (JP) .................. 2007-192979

(51) Int. Cl.
*H04B 10/00* (2006.01)

(52) U.S. Cl. ........ 398/135; 398/164; 398/136; 398/138; 398/139; 398/65; 398/152; 398/128; 398/130; 385/88; 385/89; 385/90; 385/92; 385/93; 257/82; 257/E33.077; 257/E33.067; 257/E31.095

(58) Field of Classification Search ........... 398/135, 398/136, 137, 138, 139, 164, 79, 128, 130, 398/140, 141, 158, 159, 41, 42, 65, 152; 385/88, 89, 90, 92, 93, 94, 14, 15, 33, 49, 385/52; 257/82, E33.077, E31.095, E33.067
See application file for complete search history.

(56) References Cited

U.S. PATENT DOCUMENTS

| | | | |
|---|---|---|---|
| 2005/0053379 A1* | 3/2005 | Jockerst et al. | 398/139 |
| 2005/0213983 A1* | 9/2005 | Shie et al. | 398/135 |
| 2006/0038191 A1 | 2/2006 | Onishi et al. | |
| 2007/0025404 A1 | 2/2007 | Hiramatsu | |
| 2007/0025405 A1* | 2/2007 | Pan et al. | 372/50.21 |
| 2007/0036493 A1* | 2/2007 | Brenner et al. | 385/89 |
| 2007/0058982 A1 | 3/2007 | Onishi et al. | |
| 2008/0107422 A1* | 5/2008 | Cole | 398/135 |

FOREIGN PATENT DOCUMENTS

| | | |
|---|---|---|
| JP | 62-076569 | 4/1987 |
| JP | 07-050431 | 2/1995 |
| JP | 2000-269586 | 9/2000 |
| JP | 2002-324935 | 11/2002 |
| JP | 2003-124913 | 4/2003 |
| JP | 2004-253931 | 9/2004 |
| JP | 2005-012558 | 1/2005 |
| WO | WO 02/060024 A2 | 8/2002 |

OTHER PUBLICATIONS

T. Onishi et al., "Polarization Control of VCSEL Array Utilizing Surface Plasmon Resonance," IEICE Technical Report, (Dec. 2006), w/ English translation thereof.

* cited by examiner

*Primary Examiner* — Hanh Phan
(74) *Attorney, Agent, or Firm* — McDermott Will & Emery LLP

(57) ABSTRACT

An optical transmission/reception device includes at least one light emitting portion and at least one light receiving portion on the same substrate. The light emitting portion includes at least a lower multilayer reflector and an active layer provided on the lower multilayer reflector. A metal layer including a plurality of opening portions is provided in an upper portion of the light emitting portion. Each of the opening portions has a size smaller than a light emission wavelength of the light emitting portion.

24 Claims, 12 Drawing Sheets

OPTICAL TRANSMISSION/RECEPTION DEVICE AND OPTICAL COMMUNICATION SYSTEM USING THE SAME

BACKGROUND OF THE INVENTION

1. Field of the Invention

The present invention relates to an optical transmission/reception device for use in polarization multiplexing optical communication and an optical communication system using the device.

2. Description of the Related Art

In recent years, as computerization rapidly increases, data communication traffic rapidly increases in both backbone communication networks and consumer apparatuses and terminals. Therefore, there is a demand for a higher communication rate and a larger communication capacity. To meet the demand, an optical communication technique that is conventionally employed in backbone communication networks and in which a device for converting an electrical signal into an optical signal or vice versa, such as a semiconductor laser (light emitting device), a photodiode (light receiving device) or the like, is used, is becoming widespread in consumer apparatuses that conventionally employ a low-rate communication technique using electrical signals. However, consumer apparatuses or the like require a reduction in cost more strongly than backbone communication networks or the like do. The use of a very high-rate light emitting device or light receiving device for a single channel is not suitable for consumer apparatuses, since those devices are considerably expensive and an advanced peripheral system is also required. Therefore, a device is contemplated that has a relatively low rate as it is used singly, but has an increased communication capacity due to multiplexing of wavelengths, polarizations or the like. Particularly, a polarization multiplexing technique that allows optical signals having different polarized states to be simultaneously transmitted through a single optical fiber, is expected as an inexpensive and high-rate communication means since it can cause the number of channels to increase with an increase in the number of polarized states, i.e., the communication capacity can be increased.

FIG. 14 is a diagram showing an exemplary conventional optical communication system that is disclosed as means for generating a polarization multiplexed optical signal in Japanese Unexamined Patent Application Publication No. 2003-124913. In FIG. 14, double-headed arrows indicate polarization directions.

As shown in FIG. 14, horizontally-polarized waves 101 and vertically-polarized waves 102 that are output from two laser devices are transmitted through two polarization maintaining optical fibers 104A and 104B, respectively, that are connected to an input side of a polarization multiplexer 100 in a manner that allows the two types of polarized waves to enter in directions different by 90 degrees from each other. A signal that is output from an output side of the polarization multiplexer 100 to a polarization maintaining optical fiber 104C is orthogonal polarization multiplexed light 103 including optical signals having two polarized states where two types of polarized waves are oriented in directions different by 90 degrees from each other.

SUMMARY OF THE INVENTION

However, when the above-described conventional configuration is used, there needs, as the means for generating a polarization multiplexed optical signal, a polarization multiplexer, two polarization maintaining optical fibers provided at the input side of the polarization multiplexer, and a single polarization maintaining optical fiber provided at the output side of the polarization multiplexer. Therefore, the number of parts increases, resulting in an increase in size of the system and cost.

In addition, a coupling portion for coupling the polarization multiplexer and the optical fiber is required, resulting in a difficulty in long-distance communication due to coupling loss. Also, the two optical fibers need to be connected to the polarization multiplexer so that the two types of polarized waves are directed in directions different by 90 degrees from each other. To achieve this, the steps of positioning the optical fibers and adjusting the coupling angles between the optical fibers and the polarization multiplexer are required, resulting in a difficulty in cost reduction.

Also, when a multi-channel polarization multiplexed optical signal is received by using the above-described conventional configuration, analyzers and photodetectors need to be provided in the same number as the number of polarized states contained in the polarization multiplexed optical signal, so that the configuration of a receiver cannot be simplified. In this case, further, the polarization multiplexed optical signal needs to be split by a prism or the like. As a result, the intensity of the signal is reduced, leading to a deterioration in S/N or the like.

Also, when the above-described conventional configuration is used so as to bidirectionally transmit a signal, a plurality of sender systems and a plurality of receiver systems, and a plurality of polarization multiplexers and a plurality of optical fibers are required, unavoidably leading to an increase in size of the system and cost.

In view of the above-described problems, the present invention has been achieved. An object of the present invention is to provide a bidirectional optical transmission/reception device that can be implemented with a smaller number of parts and by simple adjustment and that can transmit and receive a polarization multiplexed optical signal, and a polarization multiplexing optical communication system employing the device.

To achieve the object, an optical transmission/reception device according to the present invention includes a light emitting portion and a light receiving portion on the same substrate, where the polarization direction of light emitted from the light emitting portion is arbitrarily controlled by a metal hole array.

Specifically, an optical transmission/reception device according to an aspect of the present invention includes at least one light emitting portion and at least one light receiving portion on the same substrate. The light emitting portion includes at least a lower multilayer reflector and an active layer provided on the lower multilayer reflector. A first metal layer including a plurality of opening portions is provided in an upper portion of the light emitting portion. Each of the plurality of opening portions has a size smaller than a light emission wavelength of the light emitting portion.

Note that, in the present invention, the size of the opening portion in the metal layer serving as the metal hole array refers to, for example, a diameter if the opening portion has a circular shape as viewed from the top, or a diagonal or the like if the opening portion has a polygonal shape as viewed from the top, i.e., a maximum size of a shape as viewed from the top.

According to the optical transmission/reception device of the aspect of the present invention, since the light emitting portion and the light receiving portion are provided on the same substrate, the optical transmission/reception device can be composed of a smaller number of parts. By providing the light emitting portion and the light receiving portion close to each other, the light emitting portion and the light receiving portion can be directly coupled with an optical waveguide, such as an optical fiber or the like, by performing alignment once, resulting in a significant reduction in cost of packaging and alignment. Further, since the polarization direction of light emitted from the light emitting portion that is provided along with the light receiving portion on the same substrate can be arbitrarily controlled by the metal hole array, a polarization multiplexed optical signal can be easily bidirectionally transmitted and received.

In the optical transmission/reception device according to the aspect of the present invention, a reflectance at an upper surface of the light emitting portion is preferably higher than a reflectance at an upper surface of the light receiving portion. Thereby, the light emitting portion is allowed to efficiently perform laser oscillation, and the light receiving portion is allowed to efficiently receive signal light.

In the optical transmission/reception device according to the aspect of the present invention, the lower multilayer reflector is preferably provided in common in the light emitting portion and the light receiving portion. Thereby, the optical transmission/reception device of the present invention can be easily manufactured. In this case, if pits and projections are provided in a surface of the active layer in the light receiving portion, signal light is prevented from being reflected on a surface of the light receiving portion, thereby making it possible to improve the efficiency of light reception.

In the optical transmission/reception device according to the aspect of the present invention, a second metal layer including a plurality of opening portions is preferably provided in an upper portion of the light receiving portion, each of the plurality of opening portions having a size smaller than the light emission wavelength of the light emitting portion. Thereby, a light emitting portion for emitting only linearly-polarized waves controlled in any one direction and a light receiving portion for receiving only linearly-polarized waves controlled in another direction are provided. Therefore, if two optical transmission/reception devices of the aspect of the present invention are arranged with an optical waveguide, such as an optical fiber or the like, or a space being interposed therebetween, information can be bidirectionally transmitted. Further, linearly-polarized waves of signal light beams emitted from the light emitting portions of the optical transmission/reception devices may be caused to be orthogonal to each other, and the light receiving portions of the optical transmission/reception devices may be caused to receive particular linearly-polarized waves. In this case, highly-reliable bidirectional communication free from interference between bidirectionally transmitted signals and an influence of noise, such as feedback light or the like, can be achieved.

In this case, the size of the opening portion of the second metal layer in the light receiving portion is preferably larger than the size of the opening portion of the first metal layer in the light emitting portion. Thereby, the efficiency of light reception of the light receiving portion can be improved.

Also, in this case, the plurality of opening portions of the first metal layer in the light emitting portion are preferably arranged in a rectangular grid pattern having two grid intervals different from each other and the plurality of opening portions of the second metal layer in the light receiving portion are preferably arranged in a rectangular grid pattern having two grid intervals different from each other. A direction in which the plurality of opening portions of the first metal layer in the light emitting portion are arranged in the shorter grid intervals is preferably different by 45 degrees or more from a direction in which the plurality of opening portions of the second metal layer in the light receiving portion are arranged in the shorter grid intervals. Thereby, linearly-polarized waves emitted by the light emitting portion and linearly-polarized waves received by the light receiving portion are suppressed from interfering with each other, resulting in a highly-reliable optical transmission/reception device.

Also, in this case, at least a portion of each of the first metal layer and the second metal layer is preferably made of silver, gold, platinum, or aluminum. Thereby, each metal layer can be caused to function as a reflector having a considerably high reflectance, and each metal layer can be caused to exhibit a considerably strong surface plasmon resonance effect.

Also, in this case, a reflectance of the first metal layer in the light emitting portion with respect to the light emission wavelength of the light emitting portion is preferably higher than a reflectance of the second metal layer in the light receiving portion with respect to the light emission wavelength of the light emitting portion. Thereby, a reflectance suitable for laser oscillation can be arbitrarily controlled in the light emitting portion, and a reflectance suitable for most efficient reception of signal light can be arbitrarily controlled in the light receiving portion, thereby making it possible to maximize the efficiently of light transmission and reception.

In the optical transmission/reception device according to the aspect of the present invention, an upper multilayer reflector is preferably provided between the active layer and the first metal layer in the light emitting portion. Thereby, the light emitting portion can efficiently perform laser oscillation. In this case, the upper multilayer reflector is also preferably provided in the light receiving portion. Thereby, the light receiving portion can efficiently receive signal light. When the upper multilayer reflector is also provided in the light receiving portion, the number of layers of the upper multilayer reflector in the light emitting portion is preferably larger than the number of layers of the upper multilayer reflector in the light receiving portion. Thereby, a reflectance that allows the light emitting portion to perform laser oscillation can be easily obtained, and a reflectance that allows the light receiving portion to most efficiently receive signal light can be obtained. Also, when the upper multilayer reflector is also provided in the light receiving portion, pits and projections are preferably provided on a surface of the upper multilayer reflector in the light receiving portion. In this case, signal light is suppressed from being reflected on a surface of the light receiving portion, thereby making it possible to improve the efficiency of light reception.

In the optical transmission/reception device according to the aspect of the present invention, the plurality of opening portions of the first metal layer in the light emitting portion are preferably arranged in a square grid pattern. A grid interval of the opening portions preferably satisfies:

$$0.9 \times P \leq \lambda \times (i^2+j^2)^{1/2}/(\in_1 \in_2)/(\in_1+\in_2))^{1/2} \leq 1.1 \times P$$

where P represents the grid interval of the opening portions, $\in_1$ represents a dielectric constant of the first metal layer, $\in_2$ represents a dielectric constant of a medium contacting an upper or lower surface of the first metal layer, $\lambda$ represents the light emission wavelength of the light emitting portion, and i and j represent non-negative integers. Thereby, a surface plasmon resonance effect can be reliably exhibited in the first metal layer.

In the optical transmission/reception device according to the aspect of the present invention, the plurality of opening portions of the first metal layer in the light emitting portion are preferably arranged in a rectangular grid pattern having two grid intervals different from each other. The two grid intervals preferably satisfy:

$$0.9 \times P_1 \leq \lambda \times (i^2 \times j^2)^{1/2}/(\in_1 \in_2/(\in_1 + \in_2))^{1/2} \leq 1.1 \times P_1, \text{ and}$$

$$1.1 \times P_2 \geq \lambda \times (i^2 + j^2)^{1/2}/(\in_1 \in_2/(\in_1 + \in_2))^{1/2}$$

where $P_1$ represents the shorter one of the two grid intervals, $P_2$ represents the longer one of the two grid intervals, $\in_1$ represents a dielectric constant of the first metal layer, $\in_2$ represents a dielectric constant of a medium contacting an upper or lower surface of the first metal layer, $\lambda$ represents the light emission wavelength of the light emitting portion, and i and j represent non-negative integers. Thereby, a surface plasmon resonance effect can be exhibited only in a direction in which the opening portions are arranged only in the shorter grid intervals, so that outgoing light having a high polarization ratio can be particularly obtained.

In the optical transmission/reception device according to the effect of the present invention, when the plurality of opening portions of the first metal layer in the light emitting portion are arranged in a square or rectangular grid pattern, the plurality of opening portions are preferably arranged in cycles, the cycle being smaller than or equal to the light emission wavelength of the light emitting portion, in at least one direction of the grid pattern. Thereby, a strong surface plasmon resonance effect can be obtained in the first metal layer, so that only light having a specific wavelength can be selectively emitted.

In the optical transmission/reception device according to the aspect of the present invention, the light emitting portion and the light receiving portion are preferably provided within a region having a diameter of 150 μm or less on the substrate. Thereby, the light emitting portion and the light receiving portion can be satisfactorily coupled with a single optical waveguide, such as an optical fiber or the like.

In the optical transmission/reception device according to the aspect of the present invention, the light receiving portion is preferably provided, surrounding the light emitting portion. Thereby, the light emitting portion and the light receiving portion can be satisfactorily coupled with a single optical waveguide, such as an optical fiber or the like.

In the optical transmission/reception device according to the aspect of the present invention, a light emission area of the light emitting portion is preferably smaller than a light reception area of the light receiving portion. Thereby, the shape of a light emission pattern can be controlled and the operating speed can be increased in the light emitting portion, and the sensitivity can be improved in the light receiving portion.

A first optical communication system according to an aspect of the present invention is provided in which optical transmission/reception devices of the above-described aspect of the present invention are provided, the optical transmission/reception devices are provided at both ends of an optical fiber, and a plurality of optical signals having different linear polarization directions are transmitted in the optical fiber.

According to the first optical communication system of the aspect of the present invention, bidirectionally transmitted signals do not interfere with each other, so that a highly-reliable bidirectional optical communication system can be achieved.

In the first optical communication system of the aspect of the present invention, each of the optical transmission/reception devices provided at both the ends of the optical fiber preferably has a plurality of light emitting portions and a plurality of light receiving portions. The plurality of light emitting portions preferably emit optical signals having linear polarization directions different from each other. Thereby, a configuration having a smaller number of parts can be used to provide an optical communication system in which a polarization multiplexing signal can be bidirectionally transmitted.

In the first optical communication system of the aspect of the present invention, the optical signal is preferably a time division or wavelength division signal, and the signal is preferably bidirectionally transmitted in the optical fiber. Thereby, a polarization multiplexing signal including two linearly-polarized waves orthogonal to each other can be bidirectionally transmitted.

In the first optical communication system of the aspect of the present invention, the optical fiber is preferably a polarization maintaining optical fiber. Thereby, a simple device structure and a single optical fiber can be used to achieve highly-reliable bidirectional communication with low cost.

A second optical communication system according to an aspect of the present invention, an optical communication system is provided in which a plurality of optical transmission/reception devices of the above-described aspect of the present invention are employed, and a plurality of optical signals having different linear polarization directions are transmitted via a space or an optical waveguide between the plurality of optical transmission/reception devices.

According to the second optical communication system of the aspect of the present invention, a simple device structure and easy alignment of an optical axis can be used to achieve bidirectional communication with low cost.

As described above, according to the present invention, it is possible to provide a bidirectional optical transmission/reception device that can be implemented by a smaller number of parts and only simple adjustment and in which a polarization multiplexed optical signal can be transmitted and received, and a polarization multiplexing optical communication system using the device. In other words, the present invention is useful to achieve an optical transmission/reception device required for a high-speed operation and an optical communication system employing the device, with low cost.

DETAILED DESCRIPTION OF THE PREFERRED EMBODIMENTS

First Embodiment

Figure 1:
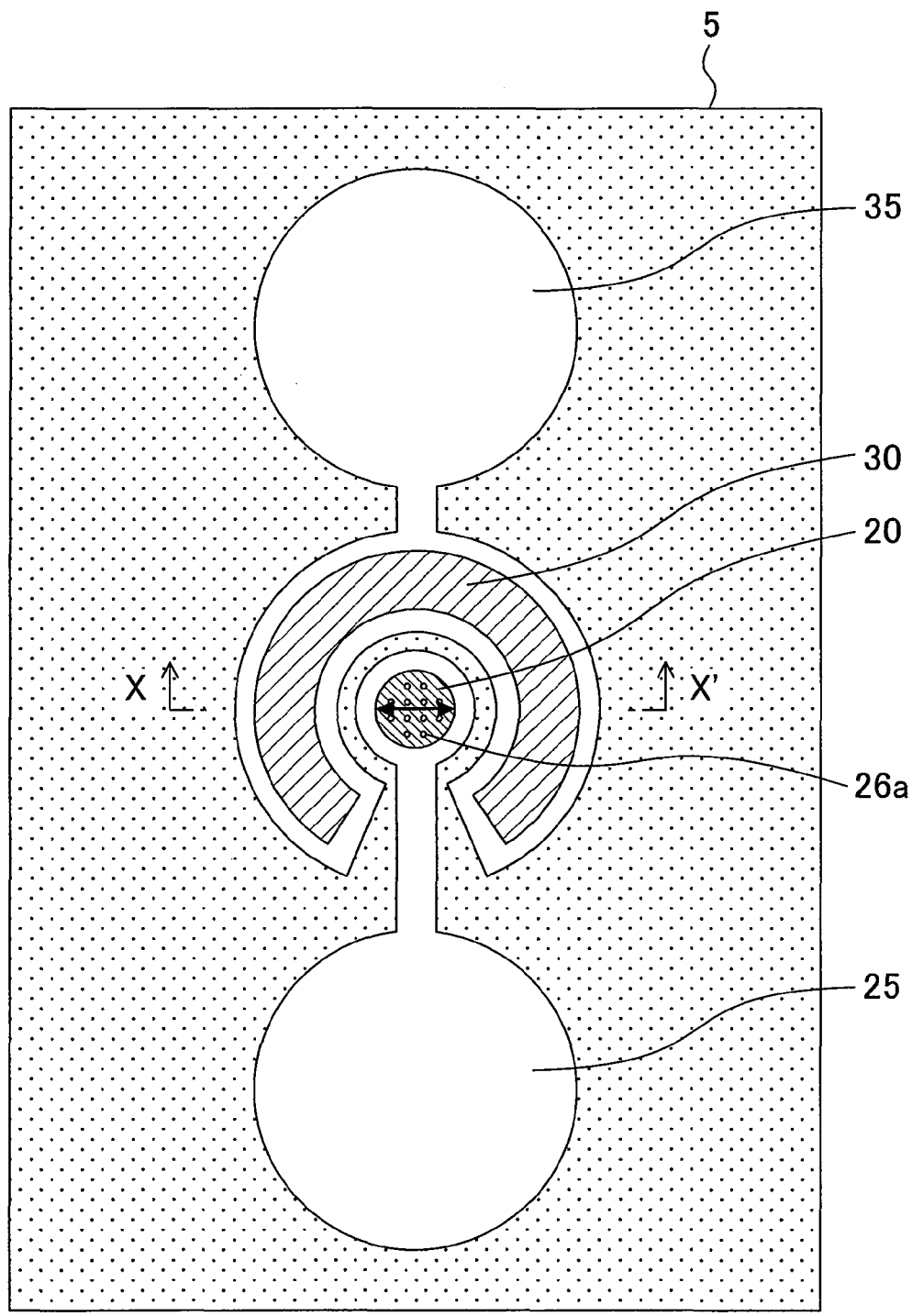
FIG. 1 is a plan view of an optical transmission/reception device according to a first embodiment of the present invention.
Figure 2:
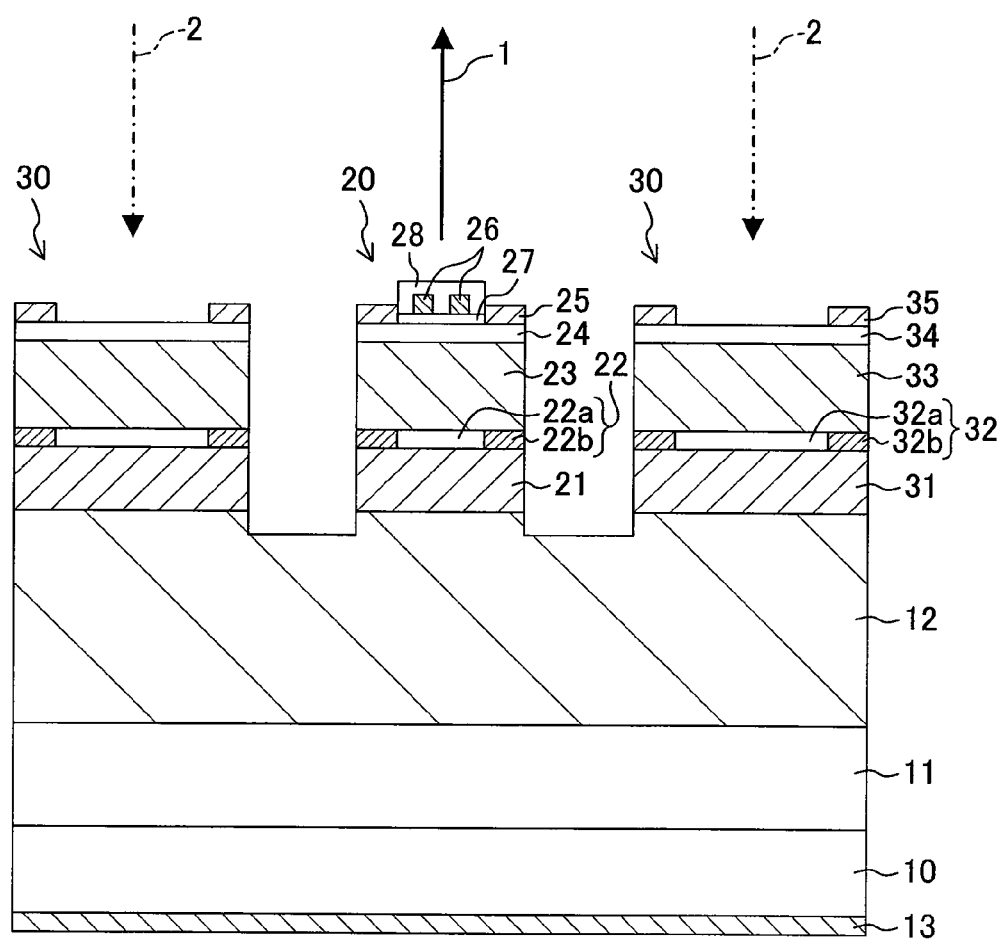
FIG. 2 is a cross-sectional view of the optical transmission/reception device of the first embodiment of the present invention.

Hereinafter, an optical transmission/reception device according to a first embodiment of the present invention will be described with reference to the accompanying drawings. FIG. 1 shows a plan view of the optical transmission/reception device of the first embodiment. FIG. 2 shows a cross-sectional view taken along line X-X' of FIG. 1. Note that FIG. 1 schematically shows an opening portion 26a of a metal hole array 26 formed in a light emitting portion 20 described below. In FIG. 1, a double-headed arrow indicates a direction of polarization.

As shown in FIGS. 1 and 2, the optical transmission/reception device 5 of this embodiment mainly comprises a light emitting portion 20 for emitting outgoing signal light 1 and a light receiving portion 30 for receiving incoming signal light 2.

Also, as shown in FIG. 2, in the optical transmission/reception device of this embodiment, the light emitting portion 20 and the light receiving portion 30 are formed on the same substrate 10. The light emitting portion 20 and the light receiving portion 30 have separate upper electrodes 25 and 35, respectively, with which the light emitting portion 20 and the light receiving portion 30 can be driven independently of each other. Note that the outgoing signal light 1 emitted from the light emitting portion 20 is linearly-polarized waves that are controlled in any direction by the metal hole array (a metal layer in which holes are formed in an array) 26 formed in an upper portion of the light emitting portion 20.

Next, a structure and an operating principle of the optical transmission/reception device of this embodiment will be described in detail. In the optical transmission/reception device of this embodiment, the light emitting portion 20 and the light receiving portion 30 have in common a structure in which an underlying layer 11 and a lower multilayer reflector 12 are successively formed on the substrate 10 and a lower electrode 13 is formed on a lower surface of the substrate 10.

The light emitting portion 20 includes a light emitting layer (active layer) 21, a current confining layer 22, an upper multilayer reflector 23, a contact layer 24, and the metal hole array 26, which are successively formed on the lower multilayer reflector 12. The current confining layer 22 includes a current confining region 22a and an oxide high-resistance region 22b surrounding the current confining region 22a. The metal hole array 26 is formed on the contact layer 24 with an intermediate layer 27 interposed therebetween. A cap layer 28 is formed, covering the metal hole array 26. The upper electrode 25 is formed on a peripheral portion of the contact layer 24, surrounding the metal hole array 26.

The light receiving portion 30 includes a light receiving layer (active layer) 31, a current confining layer 32, an upper multilayer reflector 33, and a contact layer 34, which are successively formed on the lower multilayer reflector 12. The current confining layer 32 includes a current confining region 32a and an oxide high-resistance region 32b surrounding the current confining region 32a. The upper electrode 35 is formed on a peripheral portion of the contact layer 34.

In this embodiment, the substrate 10 is made of, for example, n-type gallium arsenic (GaAs). The underlying layer 11 is formed by, for example, crystal growth of n-type GaAs on the substrate 10. The lower multilayer reflector 12 is, for example, a multilayer film in which n-type $Al_{0.12}Ga_{0.88}As$ layers and n-type $Al_{0.90}Ga_{0.10}As$ layers are alternately stacked. The layers included in the lower multilayer reflector 12 are each doped with silicon as an n-type impurity. The layers each have a film thickness of $\lambda/4\,n$, where $\lambda$ is a laser oscillation wavelength (a light emission wavelength of the light emitting portion 20) and n is the refractive index of the medium (the same applies to the following description)). The layers are stacked in 34.5 cycles.

The light emitting layer 21 and the light receiving layer 31 have, for example, a quantum well structure in which a well layer made of a non-doped GaAs layer, a barrier layer made of an $Al_{0.30}Ga_{0.70}As$ layer, and a lower spacer layer and an upper spacer layer made of an $Al_{0.30}Ga_{0.70}As$ layer are stacked. The number of the well layers is three cycles. The light emitting layer 21 and the light receiving layer 31 each have a film thickness of $\lambda/n$.

The current confining layer 22 and the current confining layer 32 are made of, for example, a p-type $Al_{0.98}Ga_{0.02}As$ layer, which is formed by replacing a portion of a p-type $Al_{0.90}Ga_{0.10}As$ layer of the upper multilayer reflector 23 and the upper multilayer reflector 33 described below.

The upper multilayer reflector 23 and the upper multilayer reflector 33 are each, for example, a multilayer film in which p-type $Al_{0.12}Ga_{0.88}As$ layers and p-type $Al_{0.90}Ga_{0.10}As$ layers are alternately stacked. The layers included in the upper multilayer reflector 23 and the upper multilayer reflector 33 are each doped with carbon as a p-type impurity. The layers each have a film thickness of $\lambda/4\,n$. The layers are stacked in 9.5 cycles.

The contact layer 24 and the contact layer 34 are made of, for example, a p-type GaAs layer. In order to reduce a contact resistance to the upper electrodes 25 and 35, the p-type GaAs layer is doped with carbon as a p-type impurity at a concentration of as high as $1 \times 10^{19}$ cm$^{-3}$ or more.

Hereinafter, the light emitting portion 20 of this embodiment will be described in detail. The light emitting portion 20 is isolated from a surrounding portion (i.e., the light receiving portion 30) by a concave portion which is formed by selectively removing the contact layer 24, the upper multilayer reflector 23, the current confining layer 22, the light emitting layer 21, and a surface portion of the lower multilayer reflector 12 that are included in the light emitting portion 20 so that the lower multilayer reflector 12 is partially exposed. The light emitting portion 20 has, for example, a circular cylindrical structure having a diameter of about 20 μm. In the light emitting portion 20, the upper electrode 25 is formed, partially contacting a surface of the contact layer 24. The metal hole array 26, which is used as a metal reflector, is formed on a center portion of the surface of the contact layer 24 with the intermediate layer 27 interposed therebetween. The metal hole array 26 is covered with the cap layer 28. In this embodiment, the metal hole array 26 is made of, for example, silver (Ag) having a film thickness of 200 nm. The intermediate layer 27 is made of, for example, silicon oxide (SiO$_2$) having a film thickness of 113 nm. The cap layer 28 is made of, for example, silicon nitride (SiN) having a film thickness of 200 nm.

In the metal hole array 26, a plurality of circular opening portions are formed in a grid pattern. Note that a shape as viewed from the top of the opening portion is not particularly limited if the opening portion has a size smaller than the wavelength of outgoing light (the light emission wavelength of the light emitting portion 20). The opening portion may be in the shape of, for example, an ellipse, a rectangle, a square, a rhombus or the like.

Specifically, in the metal hole array 26 of this embodiment, a plurality of opening portions are arranged in a rectangular grid pattern that has two grid intervals different from each other. The shorter one (a grid interval in the minor-axis direction) P$_1$ of the two grid intervals is, for example, 375 nm, and the longer grid interval (a grid interval in the major-axis direction) P$_2$ is, for example, 525 nm. The grid interval P$_1$ in the minor-axis direction preferably satisfies surface plasmon resonance conditions described in expression (1) below:

$$0.9 \times P_1 \leq \lambda \times (i^2+j^2)^{1/2}/(\epsilon_1 \epsilon_2/(\epsilon_1+\epsilon_2))^{1/2} \leq 1.1 \times P_1 \quad (1)$$

where λ represents the wavelength of laser light (the light emission wavelength of the light emitting portion 20), i and j represent non-negative integers (0, 1, 2, . . . ), $\epsilon_1$ represents the dielectric constant of the metal hole array 26 (metal portion), and $\epsilon_2$ represents the dielectric constant of a medium contacting an upper or lower surface of the metal hole array 26 (expression (1) may be satisfied for the dielectric constant of a medium contacting at least one of the upper and lower surfaces of the metal hole array 26).

For example, it may be assumed that the light emission wavelength λ of laser light (the light emission wavelength of the light emitting portion 20) is 850 nm, the dielectric constant $\epsilon_1$ of the metal hole array 26 made of Ag is −32, the dielectric constant $\epsilon_2$ of the SiN layer included in the cap layer 28 contacting the upper surface of the metal hole array 26 is 4, and (i$^2$+j$^2$)=1. In this case, the grid interval P$_1$ in the minor-axis direction of the opening portions satisfying the surface plasmon resonance conditions represented by expression (1) ranges from 355 nm to 435 nm. Therefore, the value 375 nm of the grid interval P$_1$ in the minor-axis direction of this embodiment satisfies the surface plasmon resonance conditions represented by expression (1). The present inventors have experimentally found that the surface plasmon resonance effect of Ag as a material for the metal hole array 26 and SiN as a material for the cap layer 28 is stronger than the resonance effect of Ag and SiO$_2$. With the above-described structure of this embodiment, linearly-polarized light in the minor-axis direction is stronger enough to transmit through the metal hole array 26.

Thus, by arranging the opening portions in the metal hole array 26 in a manner that satisfies the surface plasmon resonance conditions, 850-nm light oscillating in a resonator (the light emitting portion 20) within the optical transmission/reception device of this embodiment is efficiently converted into surface plasmon on a surface of the metal hole array 26. The resulting surface plasmon is converted back into light on a side closer to the cap layer 28 of the metal hole array 26 and the light is emitted to the outside of the resonator.

Hereinafter, the light receiving portion 30 of this embodiment will be described in detail. The light emitting portion 20 and the light receiving portion 30 provided surrounding the concave portion around the light emitting portion 20 are formed by selectively removing the contact layer 34, the upper multilayer reflector 33, the current confining layer 32, the light receiving layer 31, and a surface portion of the lower multilayer reflector 12 that are included in the light receiving portion 30 so that the lower multilayer reflector 12 is partially exposed. In the light receiving portion 30, the upper electrode 35 is formed, partially contacting the contact layer 34. Since the upper multilayer reflector 33 is of p type, the light receiving layer 31 is of i type where it is not doped with an impurity, and the lower multilayer reflector 12 is of n type, the light receiving portion 30 can function as a PIN photodiode.

Although it has been assumed in FIG. 2 that the number of layers of the upper multilayer reflector 33 of the light receiving portion 30 is equal to the number of layers of the upper multilayer reflector 23 of the light emitting portion 20, the number of layers of the upper multilayer reflector 33 of the light receiving portion 30 may be smaller than the number of layers of the upper multilayer reflector 23 of the light emitting portion 20. In this case, a reflectance that allows the light emitting portion 20 to perform laser oscillation can be easily obtained, and a reflectance that allows the light receiving portion 30 to most efficiently receive signal light can be obtained. Alternatively, the upper multilayer reflector 33 may not be provided in the light receiving portion 30.

Although it has also been assumed in FIG. 2 that the light receiving portion 30 is caused to have a flat surface, pits and projections may be formed in any of the light receiving layer 31, the current confining layer 32, the upper multilayer reflector 33, and the contact layer 34. In this case, signal light is prevented from being reflected on the light receiving portion 30, so that the efficiency of light reception can be improved.

Figure 3:
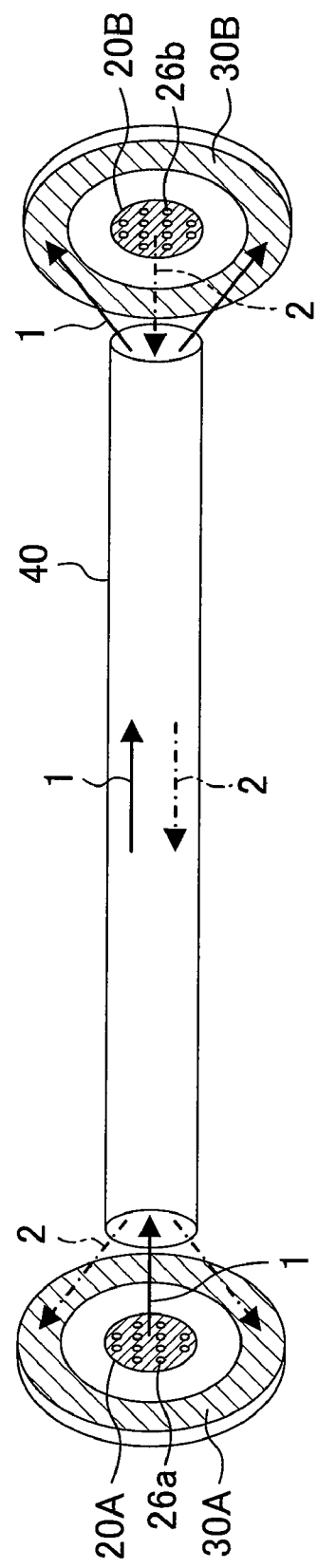
FIG. 3 is a diagram showing an exemplary optical communication system employing the optical transmission/reception device of the first embodiment of the present invention.

FIG. 3 shows an exemplary optical communication system employing the optical transmission/reception device of this embodiment. Note that, in FIG. 3, the same parts as those of FIG. 1 are indicated by the same reference numerals and will not be described. FIG. 3 also schematically shows opening portions 26a and 26b of metal hole arrays 26 formed in light emitting portions 20A and 20B. As shown in FIG. 3, an optical transmission/reception device according to this embodiment including the light emitting portion 20A for outputting horizontally-polarized waves (signal light 1) and a light receiving portion 30A for receiving vertically-polarized waves (signal light 2) is provided at one end of an optical fiber 40 that is used as a transmission line through which a signal is transmitted. Another optical transmission/reception device according to this embodiment including the light emitting portion 20B for outputting vertically-polarized waves (signal light 2) and a light receiving portion 30B for receiving horizontally-polarized waves (signal light 1) is provided at the other end of the optical fiber 40. In the optical communication system of FIG. 3, the light emitting portion 20 for transmitting a signal and the light receiving portion 30 for receiving a signal can be coupled with the single optical fiber 40 by performing axis adjustment once. Further, two signals that are transmitted in the opposite directions through the single optical fiber 40 have polarization directions different from each other, so that the two signals can be bidirectionally transmitted while preventing interference between the signals. In other words, a highly-reliable bidirectional optical communication system can be achieved. Note that, in the optical communication system of FIG. 3, a polarization maintaining optical fiber is preferably used as the optical fiber 40. In this case, highly-reliable bidirectional communication can be achieved with low cost by using a simple device structure and a single optical fiber. Also, in the optical communication system of FIG. 3, other optical waveguides may be used instead of the optical fiber 40.

Figure 4:
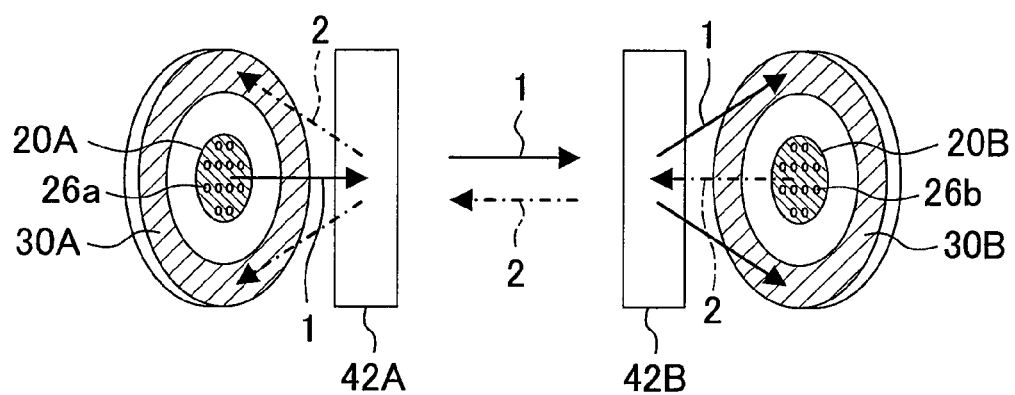
FIG. 4 is a diagram showing another exemplary optical communication system employing the optical transmission/reception device of the first embodiment of the present invention.

FIG. 4 shows an exemplary optical communication system employing the optical transmission/reception device of this embodiment. Note that, in FIG. 4, the same parts as those of FIG. 1 are indicated by the same reference numerals and will not be described. FIG. 4 also schematically shows opening portions 26a and 26b of metal hole arrays 26 formed in light emitting portions 20A and 20B, respectively. As shown in FIG. 4, an optical transmission/reception device according to this embodiment includes the light emitting portion 20A for outputting horizontally-polarized waves (signal light 1) through an optical element 42A and a light receiving portion 30A for receiving vertically-polarized waves (signal light 2) through the optical element 42A. Another optical transmission/reception device according to this embodiment includes the light emitting portion 20B for outputting vertically-polarized waves (signal light 2) through an optical element 42B and a light receiving portion 30B for receiving horizontally-polarized waves (signal light 1) through the optical element 42B. The two optical transmission/reception devices are arranged with a space being interposed therebetween. Specifically, in the optical communication system of FIG. 4, a signal can be transmitted through the space without using a transmission line, such as an optical fiber, an optical waveguide or the like. A signal output from the light emitting portion 20A for outputting horizontally-polarized waves and a signal output from the light emitting portion 20B for outputting vertically-polarized waves have linear polarization directions orthogonal to each other, so that the signals do not interfere with each other even if they are transmitted in the same space. Also, the light emitting portion 20 and the light receiving portion 30 are formed adjacent to each other. Therefore, axis adjustment between the two optical transmission/reception devices only needs to be performed once, so that cost of adjustment required for construction of an optical communication system can be significantly reduced.

As described above, according to the optical transmission/reception device of this embodiment, the light emitting portion 20 and the light receiving portion 30 are provided on the same substrate 10, resulting in an optical transmission/reception device including a smaller number of parts. Also, by arranging the light emitting portion 20 and the light receiving portion 30 close to each other, the light emitting portion 20 and the light receiving portion 30 can be directly coupled with an optical waveguide, such as an optical fiber or the like, by performing alignment once, resulting in a significant reduction in cost of packaging and alignment. Further, the polarization direction of light emitted from the light emitting portion 20 that is provided along with the light receiving portion 30 on the same substrate 10 can be arbitrarily controlled using the metal hole array 26, so that a polarization multiplexed optical signal can be easily bidirectionally transmitted and received.

Also, according to the optical transmission/reception device of this embodiment, the light emitting portion 20 and the light receiving portion 30 include the lower multilayer reflector 12 and the like in common, so that the optical transmission/reception device can be easily manufactured.

Also, according to the optical transmission/reception device of this embodiment, the light emitting portion 20 and the light receiving portion 30 have the upper multilayer reflectors 23 and 33, respectively, so that the light emitting portion 20 can efficiently perform laser oscillation and the light receiving portion 30 can efficiently receive signal light.

Note that, in the optical transmission/reception device of this embodiment, the reflectance of the upper surface of the light emitting portion 20 is preferably higher than the reflectance of the upper surface of the light receiving portion 30. In this case, the light emitting portion 20 can efficiently perform laser oscillation, and the light receiving portion 30 can efficiently receive signal light.

Also, in the optical transmission/reception device of this embodiment, the light emitting portion 20 and the light receiving portion 30 include the lower multilayer reflector 12 and the like in common. Instead of this, a general photodiode or the like may be used as the light receiving portion 30.

Also, in the optical transmission/reception device of this embodiment, silver is used as a material for the metal hole array 26. Instead of this, gold, platinum, aluminum or the like may be used.

Also, in the optical transmission/reception device of this embodiment, when a plurality of opening portions are arranged in a rectangular grid pattern within the metal hole array 26, the grid interval $P_1$ in the minor-axis direction is set to satisfy the surface plasmon resonance conditions represented by expression (1). In addition, a grid interval $P_2$ in the major-axis direction is preferably set to satisfy surface plasmon resonance conditions represented by expression (2) below.

$$1.1 \times P_2 \geq \lambda \times (i^2+j^2)^{1/2}/(\epsilon_1\epsilon_2/(\epsilon_1+\epsilon_2))^{1/2} \quad (2)$$

In this case, the surface plasmon resonance effect can be generated only in a direction in which the opening portions are arranged in the short grid intervals, so that outgoing light having a high polarization ratio can be particularly obtained.

Also, in the metal hole array 26, a plurality of opening portions may be arranged in a square grid pattern instead of a rectangular grid pattern. In this case, a grid interval P of the opening portions is preferably set to satisfy surface plasmon resonance conditions represented by expression (3) below.

$$0.9 \times P \leq \lambda \times (i^2+j^2)^{1/2}/(\epsilon_1\epsilon_2/(\epsilon_1+\epsilon_2))^{1/2} 2 \leq 1.1 \times P \quad (3)$$

Also in this case, the surface plasmon resonance effect can be reliably generated in the metal hole array 26.

Also, in the optical transmission/reception device of this embodiment, when the opening portions of the metal hole array 26 are arranged in a square grid pattern or in a rectangular grid pattern, the opening portions are preferably arranged in cycles smaller than the light emission wavelength of the light emitting portion 20 in at least one direction of the grid. In this case, a strong surface plasmon resonance effect can be obtained in the metal hole array 26, so that light having a particular wavelength can be selectively emitted.

Also, in the optical transmission/reception device of this embodiment, the light emitting portion 20 and the light receiving portion 30 are preferably formed in a region having a diameter of 150 μm or less on the substrate 10. In this case, the light emitting portion 20 and the light receiving portion 30 can be satisfactorily coupled with a single optical waveguide, such as an optical fiber or the like.

Also, in the optical transmission/reception device of this embodiment, the light receiving portion 30 is preferably arranged, surrounding the light emitting portion 20. In this case, the light emitting portion 20 and the light receiving portion 30 can be satisfactorily coupled with a single optical waveguide, such as an optical fiber or the like.

Also, in the optical transmission/reception device of this embodiment, a light emission area of the light emitting portion 20 is preferably smaller than a light reception area of the light receiving portion 30. In this case, the shape of a light emission pattern can be controlled and the operating speed can be increased in the light emitting portion 20, and the sensitivity can be improved in the light receiving portion 30.

Second Embodiment

Figure 5:
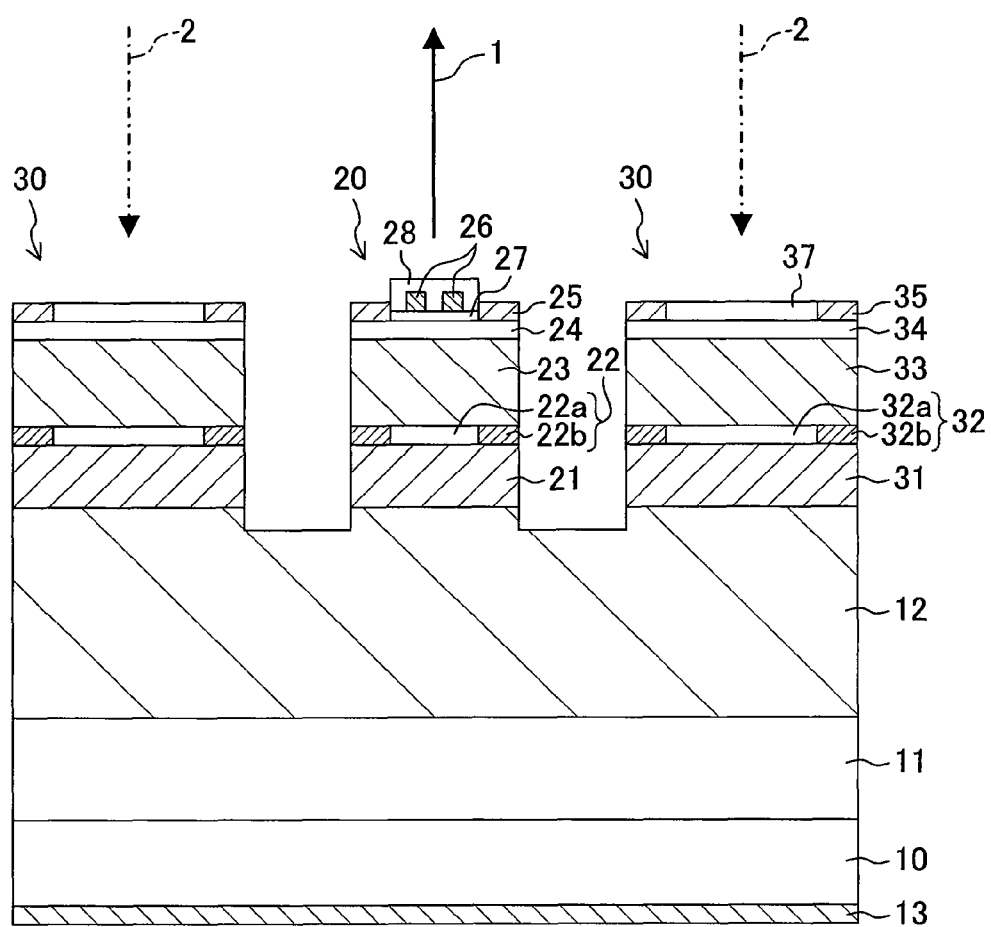
FIG. 5 is a cross-sectional view of an optical transmission/reception device according to a second embodiment of the present invention.

Hereinafter, an optical transmission/reception device according to a second embodiment of the present invention will be described with reference to the accompanying drawings. FIG. 5 shows a cross-sectional view of the optical transmission/reception device of the second embodiment. The structure as viewed from the top of the optical transmission/reception device of this embodiment is basically the same as that of the optical transmission/reception device of the first embodiment.

As shown in FIG. 5, the optical transmission/reception device of this embodiment mainly comprises a light emitting portion 20 for emitting outgoing signal light 1 and a light receiving portion 30 for receiving incoming signal light 2.

Also, as shown in FIG. 5, in the optical transmission/reception device of this embodiment, the light emitting portion 20 and the light receiving portion 30 are formed on the same substrate 10. The light emitting portion 20 and the light receiving portion 30 have separate upper electrodes 25 and 35, respectively, with which the light emitting portion 20 and the light receiving portion 30 can be driven independently of each other. Note that the outgoing signal light 1 emitted from the light emitting portion 20 is linearly-polarized waves that are controlled in any direction by a metal hole array (a metal layer in which holes are formed in an array) 26 formed in an upper portion of the light emitting portion 20.

Next, a structure and an operating principle of the optical transmission/reception device of this embodiment will be described in detail. In the optical transmission/reception device of this embodiment, the light emitting portion 20 and the light receiving portion 30 have in common a structure in which an underlying layer 11 and a lower multilayer reflector 12 are successively formed on the substrate 10 and a lower electrode 13 is formed on a lower surface of the substrate 10.

The light emitting portion 20 includes a light emitting layer (active layer) 21, a current confining layer 22, an upper multilayer reflector 23, a contact layer 24, and the metal hole array 26, which are successively formed on the lower multilayer reflector 12. The current confining layer 22 includes a current confining region 22a and an oxide high-resistance region 22b surrounding the current confining region 22a. The metal hole array 26 is formed on the contact layer 24 with an intermediate layer 27 interposed therebetween. A cap layer 28 is formed, covering the metal hole array 26. The upper electrode 25 is formed on a peripheral portion of the contact layer 24, surrounding the metal hole array 26.

The light receiving portion 30 includes a light receiving layer (active layer) 31, a current confining layer 32, an upper multilayer reflector 33, and a contact layer 34, which are successively formed on the lower multilayer reflector 12. The current confining layer 32 includes a current confining region 32a and an oxide high-resistance region 32b surrounding the current confining region 32a. An intermediate layer 37 is formed on a center portion of the contact layer 34. The upper electrode 35 is formed on a peripheral portion of the contact layer 34.

In this embodiment, the substrate 10 is made of, for example, n-type gallium arsenic (GaAs). The underlying layer 11 is formed by, for example, crystal growth of n-type GaAs on the substrate 10. The lower multilayer reflector 12 is, for example, a multilayer film in which n-type $Al_{0.12}Ga_{0.88}As$ layers and n-type $Al_{0.90}Ga_{0.10}As$ layers are alternately stacked. The layers included in the lower multilayer reflector 12 are each doped with silicon as an n-type impurity. The layers each have a film thickness of $\lambda/4$ n, where $\lambda$ is a laser oscillation wavelength (a light emission wavelength of the light emitting portion 20) and n is the refractive index of the medium (the same applies to the following description)). The layers are stacked in 34.5 cycles.

The light emitting layer 21 and the light receiving layer 31 have, for example, a quantum well structure in which a well layer made of a non-doped GaAs layer, a barrier layer made of an $Al_{0.30}Ga_{0.70}As$ layer, and a lower spacer layer and an upper spacer layer made of an $Al_{0.30}Ga_{0.70}As$ layer are stacked. The number of the well layers is three cycles. The light emitting layer 21 and the light receiving layer 31 each have a film thickness of $\lambda/n$.

The current confining layer 22 and the current confining layer 32 are made of, for example, a p-type $Al_{0.98}Ga_{0.02}As$ layer, which is formed by replacing a portion of a p-type $Al_{0.90}Ga_{0.10}As$ layer of the upper multilayer reflector 23 and the upper multilayer reflector 33 described below.

The upper multilayer reflector 23 and the upper multilayer reflector 33 are each, for example, a multilayer film in which p-type $Al_{0.12}Ga_{0.88}As$ layers and p-type $Al_{0.90}Ga_{0.10}As$ layers are alternately stacked. The layers included in the upper multilayer reflector 23 and the upper multilayer reflector 33 are each doped with carbon as a p-type impurity. The layers each have a film thickness of $\lambda/4$ n. The layers are stacked in 9.5 cycles.

The contact layer 24 and the contact layer 34 are made of, for example, a p-type GaAs layer. In order to reduce a contact resistance to the upper electrodes 25 and 35, the p-type GaAs layer is doped with carbon as a p-type impurity at a concentration of as high as $1\times10^{19}$ $cm^{-3}$ or more.

Hereinafter, the light emitting portion 20 of this embodiment will be described in detail. The light emitting portion 20 is isolated from a surrounding portion (i.e., the light receiving portion 30) by a concave portion which is formed by selectively removing the contact layer 24, the upper multilayer reflector 23, the current confining layer 22, the light emitting layer 21, and a surface portion of the lower multilayer reflector 12 that are included in the light emitting portion 20 so that the lower multilayer reflector 12 is partially exposed. The light emitting portion 20 has, for example, a circular cylindrical structure having a diameter of about 20 μm. In the light emitting portion 20, the upper electrode 25 is formed, partially contacting a surface of the contact layer 24. The metal hole array 26, which is used as a metal reflector, is formed on a center portion of the surface of the contact layer 24 with the intermediate layer 27 interposed therebetween. The metal hole array 26 is covered with the cap layer 28. In this embodiment, the metal hole array 26 is made of, for example, silver (Ag) having a film thickness of 200 nm. The intermediate layer 27 is made of, for example, silicon oxide ($SiO_2$) having a film thickness of 113 nm. The cap layer 28 is made of, for example, silicon nitride (SiN) having a film thickness of 200 nm.

In the metal hole array 26, a plurality of circular opening portions are formed in a grid pattern. Note that a shape as viewed from the top of the opening portion is not particularly limited if the opening portion has a size smaller than the wavelength of outgoing light (the light emission wavelength of the light emitting portion 20). The opening portion may be in the shape of, for example, an ellipse, a rectangle, a square, a rhombus or the like.

Specifically, in the metal hole array 26 of this embodiment, a plurality of opening portions are arranged in a rectangular grid pattern that has two grid intervals different from each other. The shorter one (a grid interval in the minor-axis direction) $P_1$ of the two grid intervals is, for example, 375 nm, and the longer grid interval (a grid interval in the major-axis direction) $P_2$ is, for example, 525 nm. The grid interval $P_1$ in the minor-axis direction preferably satisfies surface plasmon resonance conditions described in expression (1) below:

$$0.9 \times P_1 \leq \lambda \times (i^2+j^2)^{1/2}/(\in_1\in_2/(\in_1\in_2))^{1/2} \leq 1.1 \times P_1 \quad (1)$$

where λ represents the wavelength of laser light (the light emission wavelength of the light emitting portion 20), i and j represent non-negative integers (0, 1, 2, . . . ), $\in_1$ represents the dielectric constant of the metal hole array 26 (metal portion), and $\in_2$ represents the dielectric constant of a medium contacting an upper or lower surface of the metal hole array 26 (expression (1) may be satisfied for the dielectric constant of a medium contacting at least one of the upper and lower surfaces of the metal hole array 26).

For example, it may be assumed that the light emission wavelength λ of the laser light (the light emission wavelength of the light emitting portion 20) is 850 nm, the dielectric constant $\in_1$ of the metal hole array 26 made of Ag is −32, the dielectric constant $\in_2$ of the SiN layer included in the cap layer 28 contacting the upper surface of the metal hole array 26 is 4, and $(i^2+j^2)=1$. In this case, the grid interval $P_1$ in the minor-axis direction of the opening portions satisfying the surface plasmon resonance conditions represented by expression (1) ranges from 355 nm to 435 nm. Therefore, the value 375 nm of the grid interval $P_1$ in the minor-axis direction of this embodiment satisfies the surface plasmon resonance conditions represented by expression (1). The present inventors have experimentally found that the surface plasmon resonance effect of Ag as a material for the metal hole array 26 and SiN as a material for the cap layer 28 is stronger than the resonance effect of Ag and $SiO_2$. With the above-described structure of this embodiment, linearly-polarized light in the minor-axis direction is stronger enough to transmit through the metal hole array 26.

Thus, by arranging the opening portions in the metal hole array 26 in a manner that satisfies the surface plasmon resonance conditions, 850 nm light oscillating in a resonator (the light emitting portion 20) within the optical transmission/reception device of this embodiment is efficiently converted into surface plasmon on a surface of the metal hole array 26. The resulting surface plasmon is converted back into light on a side closer to the cap layer 28 of the metal hole array 26 and the light is emitted to the outside of the resonator.

Hereinafter, the light receiving portion 30 of this embodiment will be described in detail. The light emitting portion 20 and the light receiving portion 30 provided surrounding the concave portion around the light emitting portion 20 are formed by selectively removing the contact layer 34, the upper multilayer reflector 33, the current confining layer 32, the light receiving layer 31, and a surface portion of the lower multilayer reflector 12 that are included in the light receiving portion 30 so that the lower multilayer reflector 12 is partially exposed. In the light receiving portion 30, the upper electrode 35 is formed, partially contacting the contact layer 34. Since the upper multilayer reflector 33 is of p type, the light receiving layer 31 is of i type where it is not doped with an impurity, and the lower multilayer reflector 12 is of n type, the light receiving portion 30 can function as a PIN photodiode.

This embodiment is different from the first embodiment in that the intermediate layer 37 is formed on a region of the contact layer 34 surrounded by the upper electrode 35. Thereby, in addition to an effect similar to that of the first embodiment, it is possible to suppress reflection loss of the incoming signal light 2 to the light receiving portion 30 on a surface of the contact layer 34.

Although it has been assumed in FIG. 5 that the number of layers of the upper multilayer reflector 33 of the light receiving portion 30 is equal to the number of layers of the upper multilayer reflector 23 of the light emitting portion 20, the number of layers of the upper multilayer reflector 33 of the light receiving portion 30 may be smaller than the number of layers of the upper multilayer reflector 23 of the light emitting portion 20. In this case, a reflectance that allows the light emitting portion 20 to perform laser oscillation can be easily obtained, and a reflectance that allows the light receiving portion 30 to most efficiently receive signal light can be obtained. Alternatively, the upper multilayer reflector 33 may not be provided in the light receiving portion 30.

Although it has also been assumed in FIG. 5 that the light receiving portion 30 is caused to have a flat surface, pits and projections may be formed in any of the light receiving layer 31, the current confining layer 32, the upper multilayer reflector 33, the contact layer 34, and the intermediate layer 37. In this case, signal light is prevented from being reflected on the light receiving portion 30, so that the efficiency of light reception can be improved.

Third Embodiment

Figure 6:
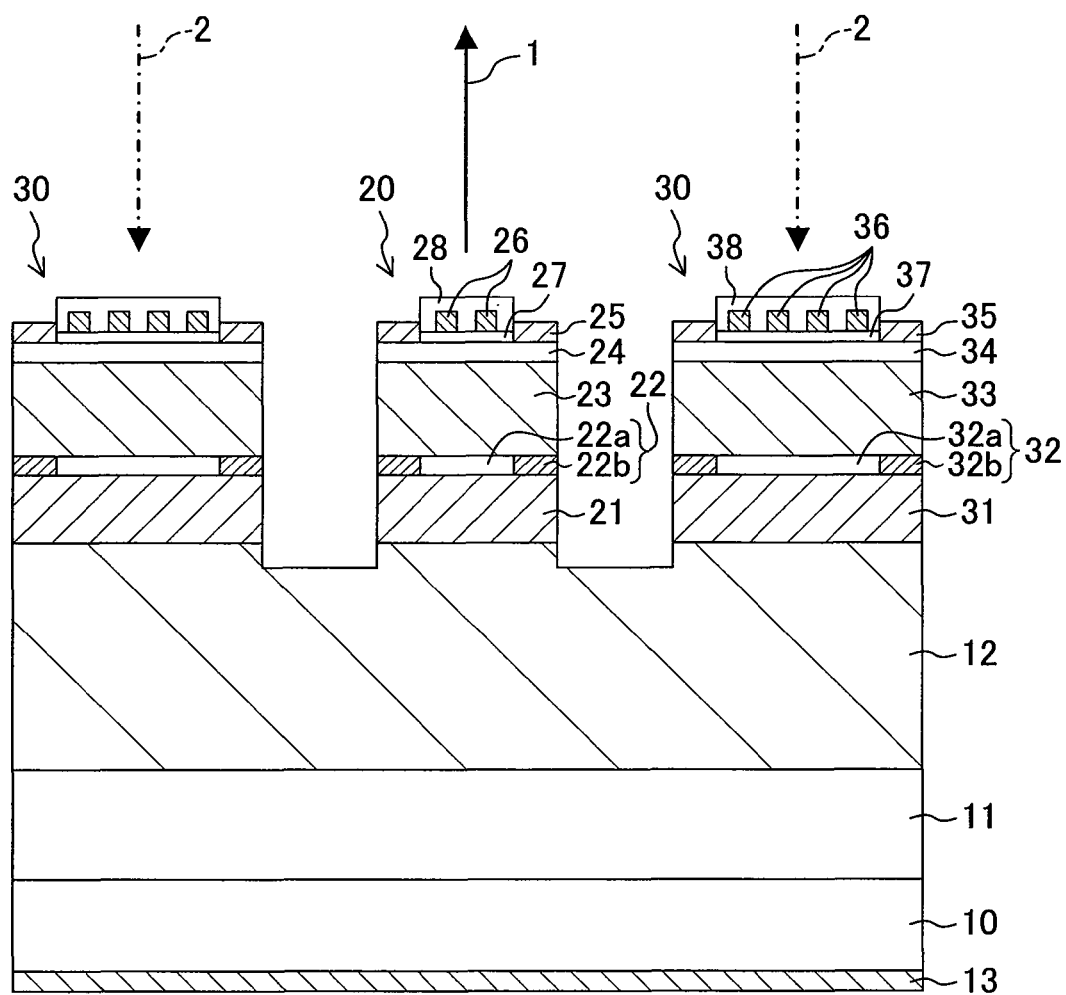
FIG. 6 is a cross-sectional view of an optical transmission/reception device according to a third embodiment of the present invention.

Hereinafter, an optical transmission/reception device according to a third embodiment of the present invention will be described with reference to the accompanying drawings. FIG. 6 shows a cross-sectional view of the optical transmission/reception device of the third embodiment. The structure as viewed from the top of the optical transmission/reception device of this embodiment is basically the same as that of the optical transmission/reception device of the first embodiment of FIG. 1, except that a light receiving portion has a metal hole array.

As shown in FIG. 6, the optical transmission/reception device of this embodiment mainly comprises a light emitting portion 20 for emitting outgoing signal light 1 and a light receiving portion 30 for receiving incoming signal light 2.

Also, as shown in FIG. 6, in the optical transmission/reception device of this embodiment, the light emitting portion 20 and the light receiving portion 30 are formed on the same substrate 10. The light emitting portion 20 and the light receiving portion 30 have separate upper electrodes 25 and 35, respectively, with which the light emitting portion 20 and the light receiving portion 30 can be driven independently of each other. Note that the outgoing signal light 1 emitted from the light emitting portion 20 is linearly-polarized waves that are controlled in any direction by a metal hole array (a metal layer in which holes are formed in an array) 26 formed in an upper portion of the light emitting portion 20.

Next, a structure and an operating principle of the optical transmission/reception device of this embodiment will be described in detail. In the optical transmission/reception device of this embodiment, the light emitting portion 20 and the light receiving portion 30 have in common a structure in which an underlying layer 11 and a lower multilayer reflector 12 are successively formed on the substrate 10 and a lower electrode 13 is formed on a lower surface of the substrate 10.

The light emitting portion 20 includes a light emitting layer (active layer) 21, a current confining layer 22, an upper multilayer reflector 23, a contact layer 24, and the metal hole array 26, which are successively formed on the lower multilayer reflector 12. The current confining layer 22 includes a current confining region 22a and an oxide high-resistance region 22b surrounding the current confining region 22a. The metal hole array 26 is formed on the contact layer 24 with an intermediate layer 27 interposed therebetween. A cap layer 28 is formed, covering the metal hole array 26. The upper electrode 25 is formed on a peripheral portion of the contact layer 24, surrounding the metal hole array 26.

The light receiving portion 30 includes a light receiving layer (active layer) 31, a current confining layer 32, an upper multilayer reflector 33, a contact layer 34, and a metal hole array 36, which are successively formed on the lower multilayer reflector 12. The current confining layer 32 includes a current confining region 32a and an oxide high-resistance region 32b surrounding the current confining region 32a. The metal hole array 36 is formed on the contact layer 34 with an intermediate layer 37 interposed therebetween. A cap layer 38 is formed, covering the metal hole array 36. The upper electrode 35 is formed on a peripheral portion of the contact layer 34, surrounding the metal hole array 36.

In this embodiment, the substrate 10 is made of, for example, n-type gallium arsenic (GaAs). The underlying layer 11 is formed by, for example, crystal growth of n-type GaAs on the substrate 10. The lower multilayer reflector 12 is, for example, a multilayer film in which n-type $Al_{0.12}Ga_{0.88}As$ layers and n-type $Al_{0.90}Ga_{0.10}As$ layers are alternately stacked. The layers included in the lower multilayer reflector 12 are each doped with silicon as an n-type impurity. The layers each have a film thickness of $\lambda/4$ n, where $\lambda$ is a laser oscillation wavelength (a light emission wavelength of the light emitting portion 20) and n is the refractive index of the medium (the same applies to the following description)). The layers are stacked in 34.5 cycles.

The light emitting layer 21 and the light receiving layer 31 have, for example, a quantum well structure in which a well layer made of a non-doped GaAs layer, a barrier layer made of an $Al_{0.30}Ga_{0.70}As$ layer, and a lower spacer layer and an upper spacer layer made of an $Al_{0.30}Ga_{0.70}As$ layer are stacked. The number of the well layers is three cycles. The light emitting layer 21 and the light receiving layer 31 each have a film thickness of $\lambda/n$.

The current confining layer 22 and the current confining layer 32 are made of, for example, a p-type $Al_{0.98}Ga_{0.2}As$ layer, which is formed by replacing a portion of a p-type $Al_{0.90}Ga_{0.10}As$ layer of the upper multilayer reflector 23 and the upper multilayer reflector 33 described below.

The upper multilayer reflector 23 and the upper multilayer reflector 33 are each, for example, a multilayer film in which p-type $Al_{0.12}Ga_{0.88}As$ layers and p-type $Al_{0.90}Ga_{0.10}As$ layers are alternately stacked. The layers included in the upper multilayer reflector 23 and the upper multilayer reflector 33 are each doped with carbon as a p-type impurity. The layers each have a film thickness of $\lambda/4$ n. The layers are stacked in 9.5 cycles.

The contact layer 24 and the contact layer 34 are made of, for example, a p-type GaAs layer. In order to reduce a contact resistance to the upper electrodes 25 and 35, the p-type GaAs layer is doped with carbon as a p-type impurity at a concentration of as high as $1 \times 10^{19}$ cm$^{-3}$ or more.

Hereinafter, the light emitting portion 20 of this embodiment will be described in detail. The light emitting portion 20 is isolated from a surrounding portion (i.e., the light receiving portion 30) by a concave portion which is formed by selectively removing the contact layer 24, the upper multilayer reflector 23, the current confining layer 22, the light emitting layer 21, and a surface portion of the lower multilayer reflector 12 that are included in the light emitting portion 20 so that the lower multilayer reflector 12 is partially exposed. The light emitting portion 20 has, for example, a circular cylindrical structure having a diameter of about 20 µm. In the light emitting portion 20, the upper electrode 25 is formed, partially contacting a surface of the contact layer 24. The metal hole array 26, which is used as a metal reflector, is formed on a center portion of the surface of the contact layer 24 with the intermediate layer 27 interposed therebetween. The metal hole array 26 is covered with the cap layer 28. In this embodiment, the metal hole array 26 is made of, for example, silver (Ag) having a film thickness of 200 nm. The intermediate layer 27 is made of, for example, silicon oxide ($SiO_2$) having a film thickness of 113 nm. The cap layer 28 is made of, for example, silicon nitride (SiN) having a film thickness of 200 nm.

In the metal hole array 26, a plurality of circular opening portions are formed in a grid pattern. Note that a shape as viewed from the top of the opening portion is not particularly limited if the opening portion has a size smaller than the wavelength of outgoing light (the light emission wavelength of the light emitting portion 20). The opening portion may be in the shape of, for example, an ellipse, a rectangle, a square, a rhombus or the like.

Specifically, in the metal hole array 26 of this embodiment, a plurality of opening portions are arranged in a rectangular grid pattern that has two grid intervals different from each other. The shorter one (a grid interval in the minor-axis direction) $P_1$ of the two grid intervals is, for example, 375 nm, and the longer grid interval (a grid interval in the major-axis direction) $P_2$ is, for example, 525 nm. The grid interval $P_1$ in the minor-axis direction preferably satisfies surface plasmon resonance conditions described in expression (1) below:

$$0.9 \times P_1 \leq \lambda \times (i^2+j^2)^{1/2}/(\in_1 \in_2/(\in_1+\in_2))^{1/2} \leq 1.1 \times P_1 \qquad (1)$$

where $\lambda$ represents the wavelength of laser light (the light emission wavelength of the light emitting portion 20), i and j represent non-negative integers (0, 1, 2, ... ), $\in_1$ represents the dielectric constant of the metal hole array 26 (metal portion), and $\in_2$ represents the dielectric constant of a medium contacting an upper or lower surface of the metal hole array 26 (expression (1) may be satisfied for the dielectric constant of a medium contacting at least one of the upper and lower surfaces of the metal hole array 26).

For example, it may be assumed that the light emission wavelength $\lambda$ of the laser light (the light emission wavelength of the light emitting portion 20) is 850 nm, the dielectric constant $\in_1$ of the metal hole array 26 made of Ag is $-32$, the dielectric constant $\in_2$ of the SiN layer included in the cap layer 28 contacting the upper surface of the metal hole array 26 is 4, and $(i^2+j^2)=1$. In this case, the grid interval $P_1$ in the minor-axis direction of the opening portions satisfying the surface plasmon resonance conditions represented by expression (1) ranges from 355 nm to 435 nm. Therefore, the value 375 nm of the grid interval $P_1$ in the minor-axis direction of this embodiment satisfies the surface plasmon resonance conditions represented by expression (1). The present inventors have experimentally found that the surface plasmon resonance effect of Ag as a material for the metal hole array 26 and SiN as a material for the cap layer 28 is stronger than the resonance effect of Ag and $SiO_2$. With the above-described structure of this embodiment, linearly-polarized light in the minor-axis direction is stronger enough to transmit through the metal hole array 26.

Thus, by arranging the opening portions in the metal hole array 26 in a manner that satisfies the surface plasmon resonance conditions, 850 nm light oscillating in a resonator (the light emitting portion 20) within the optical transmission/reception device of this embodiment is efficiently converted into surface plasmon on a surface of the metal hole array 26. The resulting surface plasmon is converted back into light on a side closer to the cap layer 28 of the metal hole array 26 and the light is emitted to the outside of the resonator.

Hereinafter, the light receiving portion 30 of this embodiment will be described in detail. The light emitting portion 20 and the light receiving portion 30 provided surrounding the concave portion around the light emitting portion 20 are formed by selectively removing the contact layer 34, the upper multilayer reflector 33, the current confining layer 32, the light receiving layer 31, and a surface portion of the lower multilayer reflector 12 that are included in the light receiving portion 30 so that the lower multilayer reflector 12 is partially exposed. In the light receiving portion 30, the upper electrode 35 is formed, partially contacting the contact layer 34. Since the upper multilayer reflector 33 is of p type, the light receiving layer 31 is of i type where it is not doped with an impurity, and the lower multilayer reflector 12 is of n type, the light receiving portion 30 can function as a PIN photodiode.

This embodiment is different from the first embodiment in that the metal hole array 36 is formed on a center portion of a surface of the contact layer 34 with the intermediate layer 37 interposed therebetween. The metal hole array 36 is also covered with the cap layer 38. Thereby, in addition to an effect similar to that of the first embodiment, it is possible to obtain the following effect.

Firstly, in this embodiment, the metal hole array 36, the intermediate layer 37 and the cap layer 38 are made of materials similar to those of the metal hole array 26, the intermediate layer 27 and the cap layer 28, respectively. Therefore, each component of the light emitting portion 20 and its corresponding component of the light emitting portion 30 can be simultaneously formed in the same step, advantageously resulting in a reduction in cost.

In the metal hole array 36 of this embodiment, a plurality of circular opening portions are formed in a rectangular grid pattern that has two grid intervals different from each other. Note that a shape as viewed from the top of the opening portion of the metal hole array 36 is not particularly limited if the opening portion has a size smaller than the wavelength of outgoing light (the light emission wavelength of the light emitting portion 20). The opening portion may be in the shape of, for example, an ellipse, a rectangle, a square, a rhombus or the like. The shorter one (a grid interval in the minor-axis direction) $P_1$ of the two grid intervals is, for example, 375 nm, and the longer grid interval (a grid interval in the major-axis direction) $P_2$ is, for example, 525 nm. Note that the minor-axis direction and the major-axis direction of the metal hole array 36 formed in the light receiving portion 30 are different by 90 degrees from the minor-axis direction and the major-axis direction of the metal hole array 26 formed in the light receiving portion 20, respectively. With such a structure, it is possible to selectively receive, as the incoming signal light 2, linearly-polarized light that is rotated by 90 degrees with respect to the outgoing signal light 1 output from the light emitting portion 20 adjacent to the light receiving portion 30. In other words, it is possible to suppress interference between linearly-polarized waves emitted by the light emitting portion 20 and linearly-polarized waves received by the light receiving portion 30. Therefore, highly-reliable polarization multiplexing bidirectional communication that is less affected by optical feedback noise or the like occurring in the optical system, can be achieved. Also, the above-described effect can be obtained if the minor-axis direction of the metal hole array 36 in the light receiving portion 30 is different by 45 degrees or more and 135 degrees or less from the minor-axis direction of the metal hole array 26 in the light emitting portion 20.

Although it has been assumed in FIG. 6 that the number of layers of the upper multilayer reflector 33 of the light receiving portion 30 is equal to the number of layers of the upper multilayer reflector 23 of the light emitting portion 20, the number of layers of the upper multilayer reflector 33 of the light receiving portion 30 may be smaller than the number of layers of the upper multilayer reflector 23 of the light emitting portion 20. In this case, a reflectance that allows the light emitting portion 20 to perform laser oscillation can be easily obtained, and a reflectance that allows the light receiving portion 30 to most efficiently receive signal light can be obtained. Alternatively, the upper multilayer reflector 33 may not be provided in the light receiving portion 30.

Although it has also been assumed in FIG. 6 that the light receiving portion 30 is caused to have a flat surface, pits and projections may be formed in any of the light receiving layer 31, the current confining layer 32, the upper multilayer reflector 33, the contact layer 34, and the intermediate layer 37. In this case, signal light is prevented from being reflected on the light receiving portion 30, so that the efficiency of light reception can be improved.

Also, it has been assumed in FIG. 6 that a size of the opening portion of the metal hole array 26 in the light emitting portion 20 is the same as a size of the opening portion of the metal hole array 36 in the light receiving portion 30. However, the size of the opening portion of the metal hole array 36 in the light receiving portion 30 may be larger than the size of the opening portion of the metal hole array 26 in the light emitting portion 20. In this case, the efficiency of light reception of the light receiving portion 30 can be improved.

Also, in this embodiment, at least a portion of each of the metal hole arrays 26 and 36 (its main body made of a metal) is preferably made of silver, gold, platinum, or aluminum. In this case, the metal hole arrays 26 and 36 can be caused to function as a reflector having a considerably high reflectance, and can be caused to generate a considerably strong surface plasmon resonance effect.

Also, in this embodiment, a reflectance of the metal hole array 26 in the light emitting portion 20 with respect to the light emission wavelength of the light emitting portion 20 is preferably higher than a reflectance of the metal hole array 36 in the light receiving portion 30 with respect to the light emission wavelength of the light emitting portion 20. In this case, a reflectance suitable for laser oscillation can be arbitrarily controlled in the light emitting portion 20, and a reflectance suitable for most efficient reception of signal light can be arbitrarily controlled in the light receiving portion 30. Thereby, it is possible to maximize the efficiency of light transmission and reception.

Figure 7:
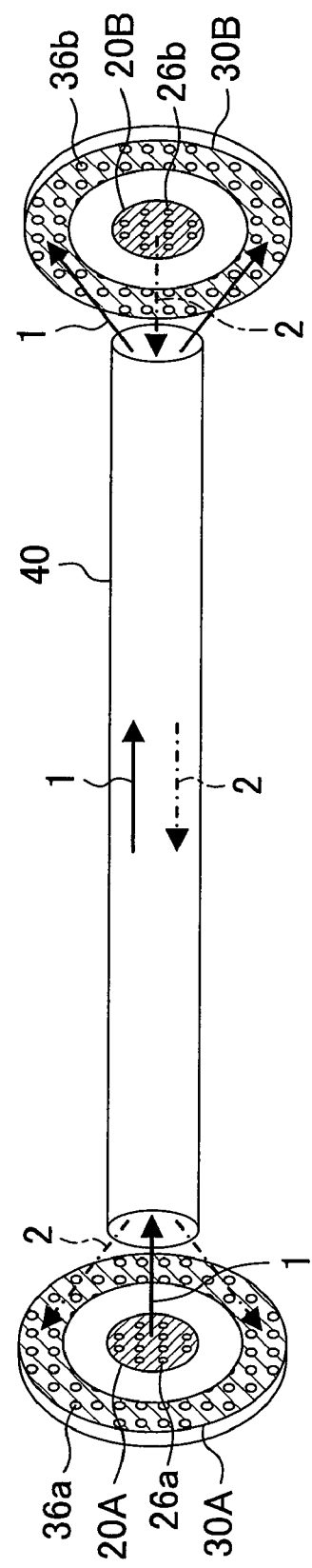
FIG. 7 is a diagram showing an exemplary optical communication system employing the optical transmission/reception device of the third embodiment of the present invention.

FIG. 7 shows another exemplary optical communication system employing the optical transmission/reception device of this embodiment. Note that, in FIG. 7, the same parts as those of FIG. 6 are indicated by the same reference numerals and will not be described. FIG. 7 also schematically shows opening portions 26a and 26b of metal hole arrays 26 formed in light emitting portions 20A and 20B, and opening portions 36a and 36b of metal hole arrays 36 formed in light emitting portions 30A and 30B. As shown in FIG. 7, an optical transmission/reception device according to this embodiment including the light emitting portion 20A for outputting horizontally-polarized waves (signal light 1) and a light receiving portion 30A for receiving vertically-polarized waves (signal light 2) is provided at one end of an optical fiber 40 that is used as a transmission line through which a signal is transmitted. Another optical transmission/reception device according to this embodiment including the light emitting portion 20B for outputting vertically-polarized waves (signal light 2) and a light receiving portion 30B for receiving horizontally-polarized waves (signal light 1) is provided at the other end of the optical fiber 40. In the optical communication system of FIG. 7, the light emitting portion 20 for transmitting a signal and the light receiving portion 30 for receiving a signal can be coupled with the single optical fiber 40 by performing axis adjustment once. Further, two signals that are transmitted in the opposite directions through the single optical fiber 40 have polarization directions different from each other, so that the two signals can be bidirectionally transmitted while preventing interference between the signals. In other words, a highly-reliable bidirectional optical communication system can be achieved. Further, the light receiving portion 30A for receiving vertically-polarized waves (signal light 2) and the light receiving portion 30B for receiving horizontally-polarized waves (signal light 1) receive only respective particular polarized waves. Therefore, even if light from the light emitting portion 20A or 20B adjacent to the light receiving portion 30A or 30B enters the light receiving portion 30A or 30B as feedback light from an optical system, such as a fiber coupling portion, an optical component or the like, the light receiving portion 30A or 30B is not affected by the noise, since the direction of the polarized waves received by the light receiving portion 30A or 30B is different from the direction of the polarized waves received by the light emitting portion 20A or 20B adjacent thereto. Therefore, considerably highly-reliable signal transmission can be achieved. Note that, in the optical communication system of FIG. 7, a polarization maintaining optical fiber is preferably used as the optical fiber 40. In this case, highly-reliable bidirectional communication can be achieved with low cost by using a simple device structure and a single optical fiber. Also, in the optical communication system of FIG. 7, although the optical fiber 40 is used as a transmission line, the present invention is not limited to optical fibers. Optical waveguides made of silicon, a polymer or the like can be used as a transmission line.

Figure 8:
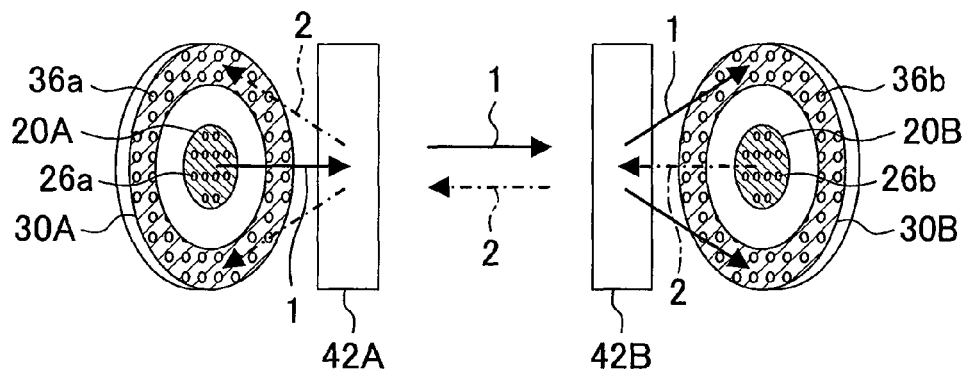
FIG. 8 is a diagram showing another exemplary optical communication system employing the optical transmission/reception device of the third embodiment of the present invention.

FIG. 8 shows another exemplary optical communication system employing the optical transmission/reception device of this embodiment. Note that, in FIG. 8, the same parts as those of FIG. 6 are indicated by the same reference numerals and will not be described. FIG. 8 also schematically shows opening portions 26a and 26b of metal hole arrays 26 formed in light emitting portions 20A and 20B, respectively, and opening portions 36a and 36b of metal hole arrays 36 formed in light emitting portions 30A and 30B, respectively. As shown in FIG. 8, an optical transmission/reception device of this embodiment includes the light emitting portion 20A for outputting horizontally-polarized waves (signal light 1) through an optical element 42A and a light receiving portion 30A for receiving vertically-polarized waves (signal light 2) through the optical element 42A. Another optical transmission/reception device of this embodiment includes the light emitting portion 20B for outputting vertically-polarized waves (signal light 2) through an optical element 42B and a light receiving portion 30B for receiving horizontally-polarized waves (signal light 1) through the optical element 42B. The two optical transmission/reception devices are arranged with a space being interposed therebetween. Specifically, in the optical communication system of FIG. 8, a signal can be transmitted through the space without using a transmission line, such as an optical fiber, an optical waveguide or the like. A signal output from the light emitting portion 20A for outputting horizontally-polarized waves and a signal output from the light emitting portion 20B for outputting vertically-polarized waves have linear polarization directions orthogonal to each other, so that the signals do not interfere with each other even if they are transmitted in the same space. Also, the light emitting portion 20 and the light receiving portion 30 are formed adjacent to each other. Therefore, axis adjustment between the two optical transmission/reception devices only needs to be performed once, so that cost of adjustment required for construction of an optical communication system can be significantly reduced.

Fourth Embodiment

Figure 9:
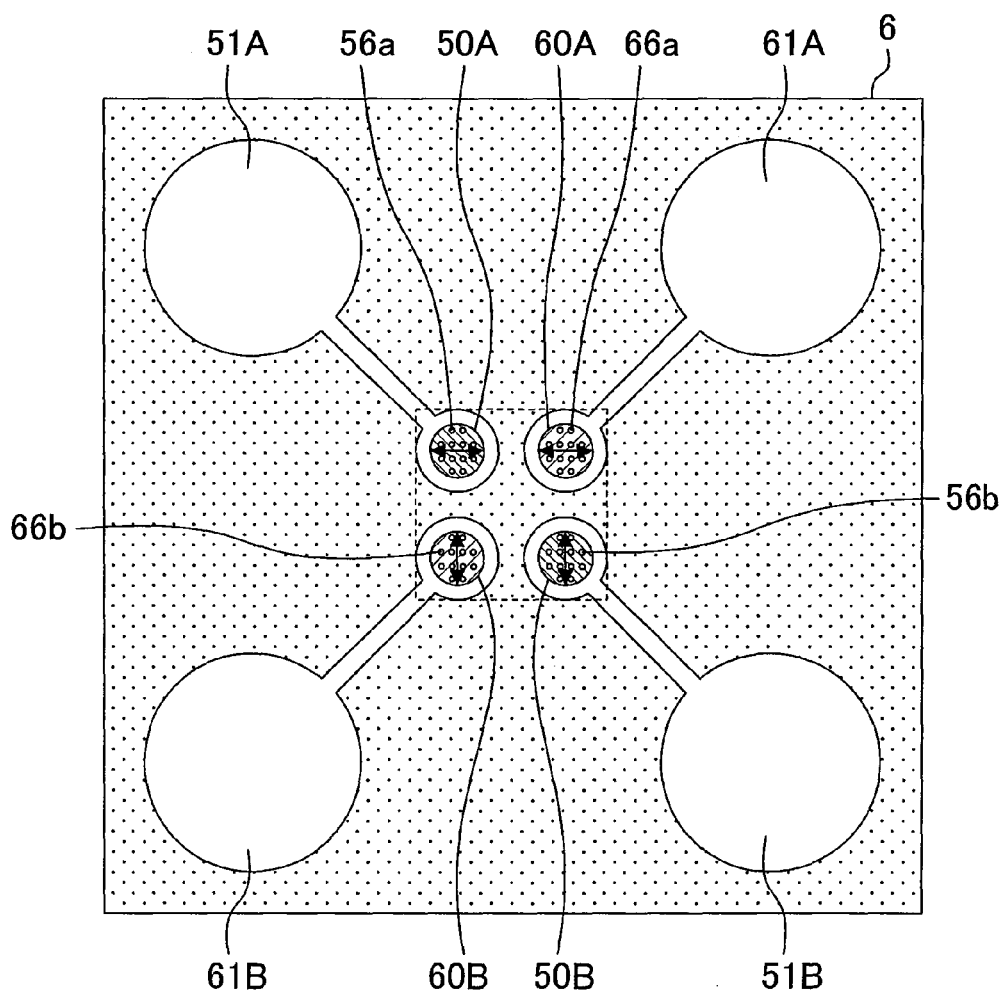
FIG. 9 is a plan view of an optical transmission/reception device according to a fourth embodiment of the present invention.

Hereinafter, an optical transmission/reception device according to a fourth embodiment of the present invention will be described with reference to the accompanying drawings. FIG. 9 shows a plan view of the optical transmission/reception device of the fourth embodiment. Note that FIG. 9 schematically shows opening portions 56a, 56b, 66a, and 66b of metal hole arrays formed in light emitting portions 50A and 50B and light receiving portions 60A and 60B, respectively. In FIG. 9, double-headed arrows indicate polarization directions.

As shown in FIG. 9, the optical transmission/reception device 6 of this embodiment mainly includes the first light emitting portion 50A for outputting horizontally-polarized waves, the second light emitting portion 50B for outputting vertically-polarized waves, the first light receiving portion 60A for receiving horizontally-polarized waves, and the second light receiving portion 60B for receiving vertically-polarized waves. Specifically, in the optical transmission/reception device 6 of this embodiment, two light emitting portions including the first light emitting portion 50A for outputting horizontally-polarized waves and the second light emitting portion 50B for outputting vertically-polarized waves, and two light receiving portions including the first light receiving portion 60A for receiving horizontally-polarized waves and the second light receiving portion 60B for receiving vertically-polarized waves, are formed on the same substrate. Also, the light emitting portions 50A and 50B and the light receiving portions 60A and 60B have separate upper electrodes 51A, 51B, 61A and 61B, respectively, so that the light emitting portions 50A and 50B and the light receiving portions 60A and 60B can be driven independently of each other. Note that a structure and an operating principle of the optical transmission/reception device of this embodiment are similar to those of the third embodiment, except for linear polarization directions.

Figure 10:
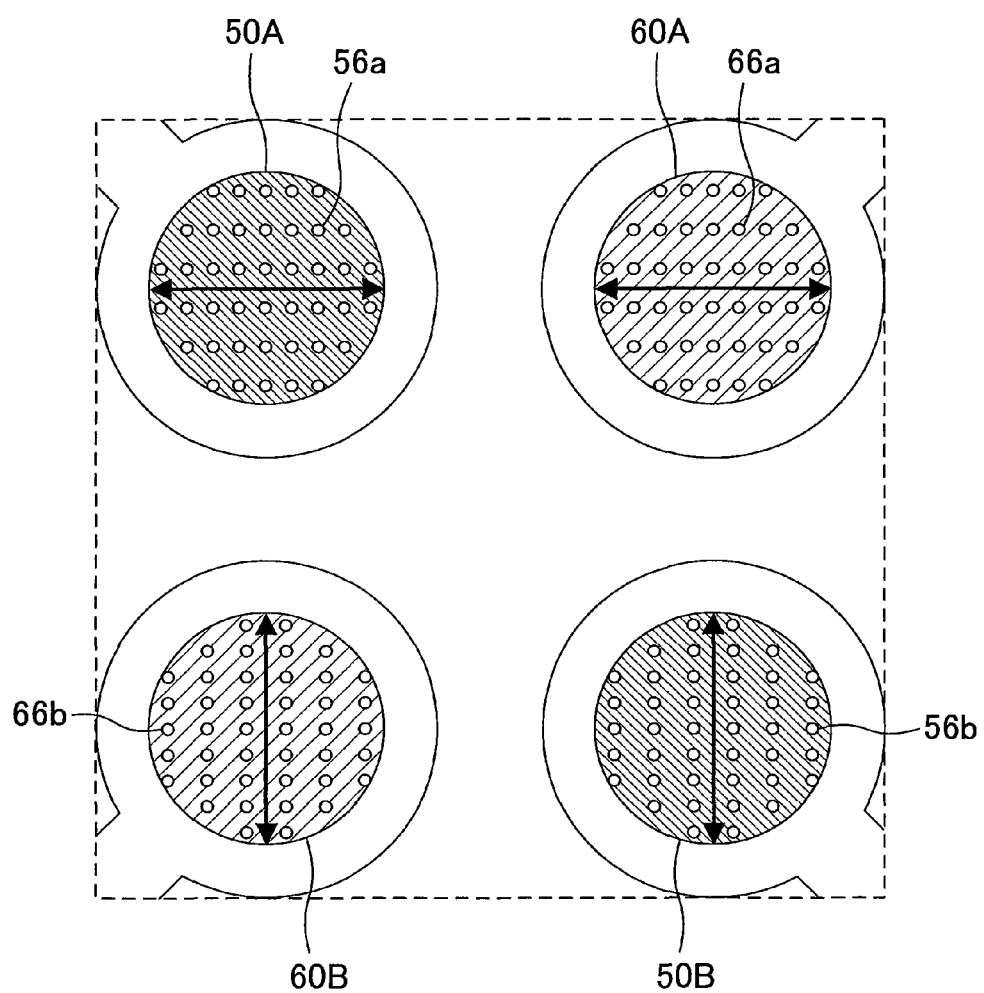
FIG. 10 is an enlarged plan view of an exemplary dashed-line region of FIG. 9.

FIG. 10 is an enlarged plan view of an exemplary region of FIG. 9 indicated by a dashed line (hereinafter referred to as a dashed-line portion of FIG. 9). As shown in FIG. 10, the two light emitting portions including the first light emitting portion 50A for outputting horizontally-polarized waves and the second light emitting portion 50B for outputting vertically-polarized waves, and the two light receiving portions including the first light receiving portion 60A for receiving horizontally-polarized waves and the second light receiving portion 60B for receiving vertically-polarized waves, are arranged close to each other. With such a structure, the four elements can be easily coupled with a single optical fiber by performing axis adjustment once. In addition, as described above, it is possible to drive the two light emitting portions and the two light receiving portions having different polarization directions independently of each other, so that highly practical polarization multiplexing communication can achieved with low cost.

Figure 11:
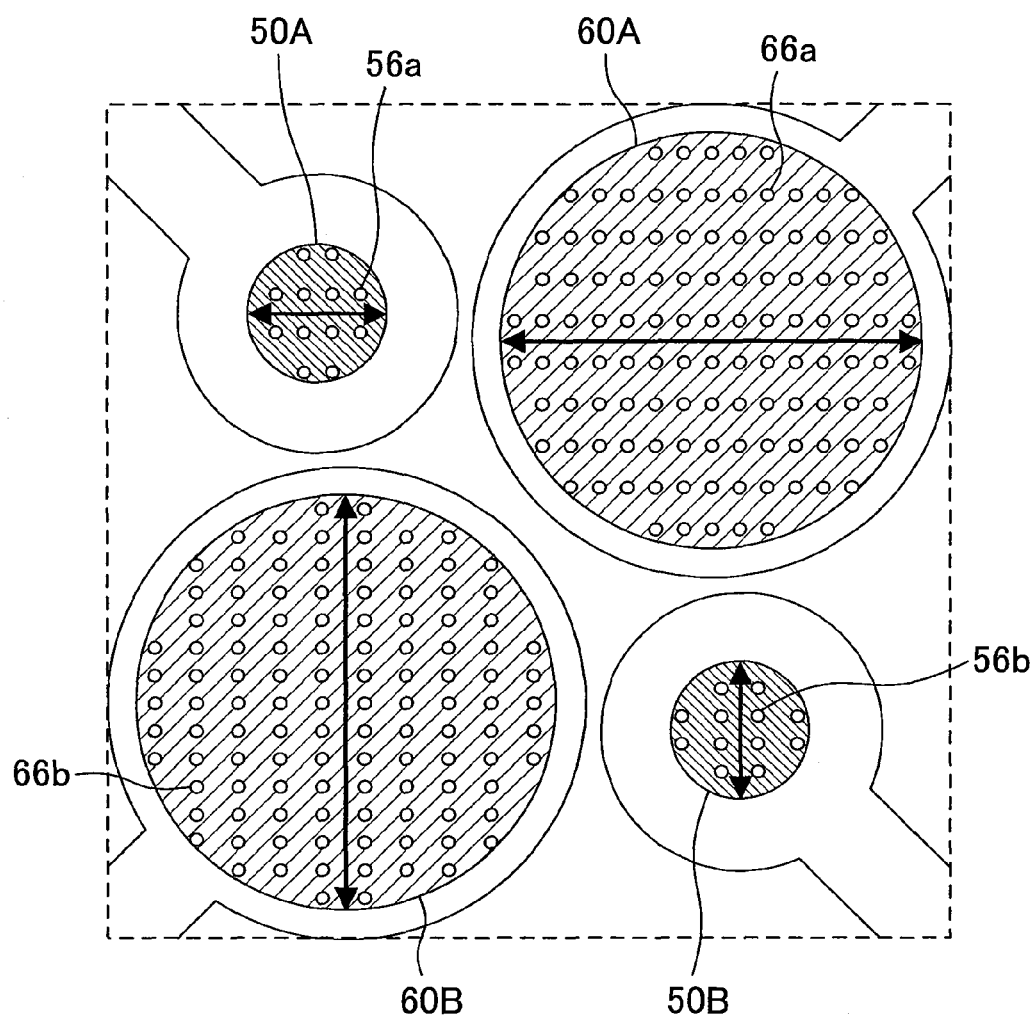
FIG. 11 is an enlarged plan view of another exemplary dashed-line region of FIG. 9.

FIG. 11 shows an enlarged plan view of another exemplary dashed-line region of FIG. 9. The structure as viewed from the top of FIG. 11 is different from that of FIG. 10 in that the two light emitting portions including the first light emitting portion 50A for outputting horizontally-polarized waves and the second light emitting portion 50B for outputting vertically-polarized waves have diameters that are set to be smaller than those of the two light receiving portions including the first light receiving portion 60A for receiving horizontally-polarized waves and the second light receiving portion 60B for receiving vertically-polarized waves. With such a structure, the operating speed of the two light emitting portions including the first light emitting portion 50A for outputting horizontally-polarized waves and the second light emitting portion 50B for outputting vertically-polarized waves is significantly improved. In addition, the light reception sensitivity of the two light receiving portions including the first light receiving portion 60A for receiving horizontally-polarized waves and the second light receiving portion 60B for receiving vertically-polarized waves is significantly improved. Thereby, highly-reliable polarization multiplexing communication can be achieved.

Figure 12:
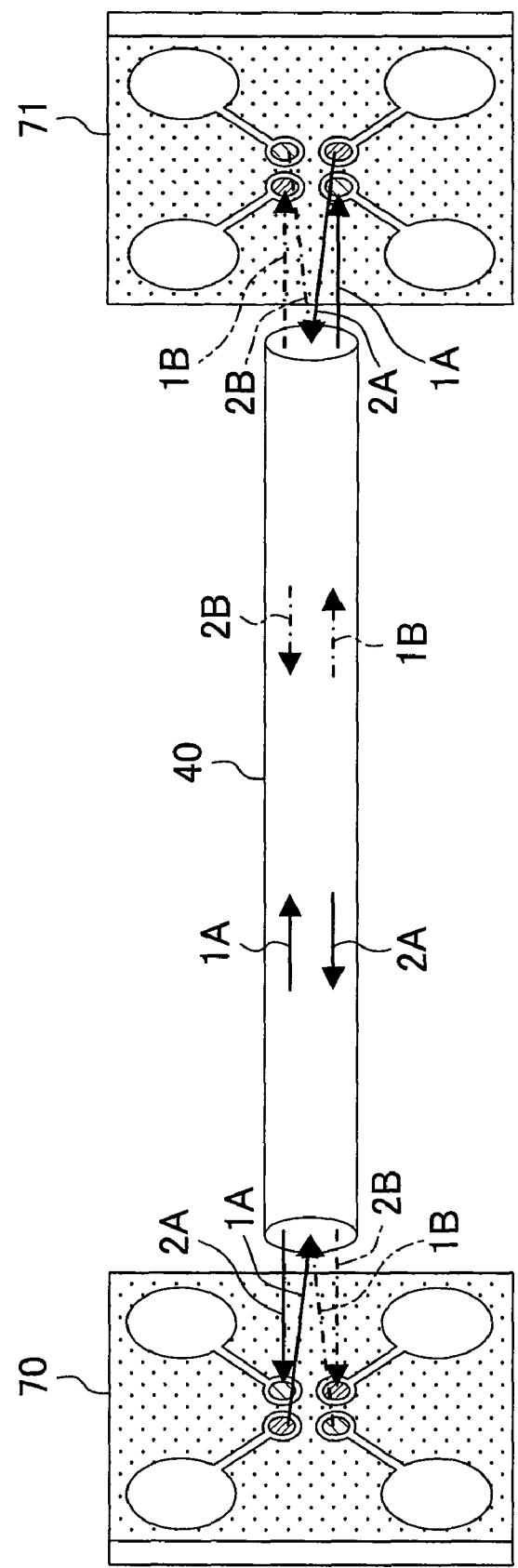
FIG. 12 is a diagram showing an exemplary optical communication system employing the optical transmission/reception device of the fourth embodiment of the present invention.

FIG. 12 shows an exemplary optical communication system employing the optical transmission/reception device of this embodiment. As shown in FIG. 12, an optical transmission/reception device 70 according to this embodiment having two light emitting portions for outputting horizontally-polarized waves (signal light 1A) and vertically-polarized waves (signal light 1B) and two light receiving portions for receiving horizontally-polarized waves (signal light 2A) and vertically-polarized waves (signal light 2B), is provided at an end of an optical fiber 40 that is used as a transmission line for transmitting a signal. Another optical transmission/reception device 71 according to this embodiment having two light emitting portions for outputting horizontally-polarized waves (signal light 2A) and vertically-polarized waves (signal light 2B) and two light receiving portions for receiving horizontally-polarized waves (signal light 1A) and vertically-polarized waves (signal light 1B), is provided at the other end of the optical fiber 40. In the optical communication system of FIG. 12, the two light emitting portions for transmitting a signal and the two light receiving portions for receiving a signal can be coupled with the single optical fiber 40 by performing axis adjustment once. Further, two signals that are transmitted in the same direction through the single optical fiber 40 have polarization directions different from each other, so that polarization multiplexing information transmission can be performed while preventing interference between the signals. Further, when a time division communication technique, a wavelength division communication technique or the like is applied, similar polarization multiplexing information transmission can be bidirectionally achieved. In other words, a highly-reliable bidirectional optical communication system can be achieved. Note that, in the optical communication system of FIG. 12, a polarization maintaining optical fiber is preferably used as the optical fiber 40. In this case, highly-reliable bidirectional communication can be achieved with low cost by using a simple device structure and a single optical fiber. Also, in the optical communication system of FIG. 12, although the optical fiber 40 is used as a transmission line, the present invention is not limited to optical fibers. Optical waveguides made of silicon, a polymer or the like can be used as a transmission line.

Figure 13:
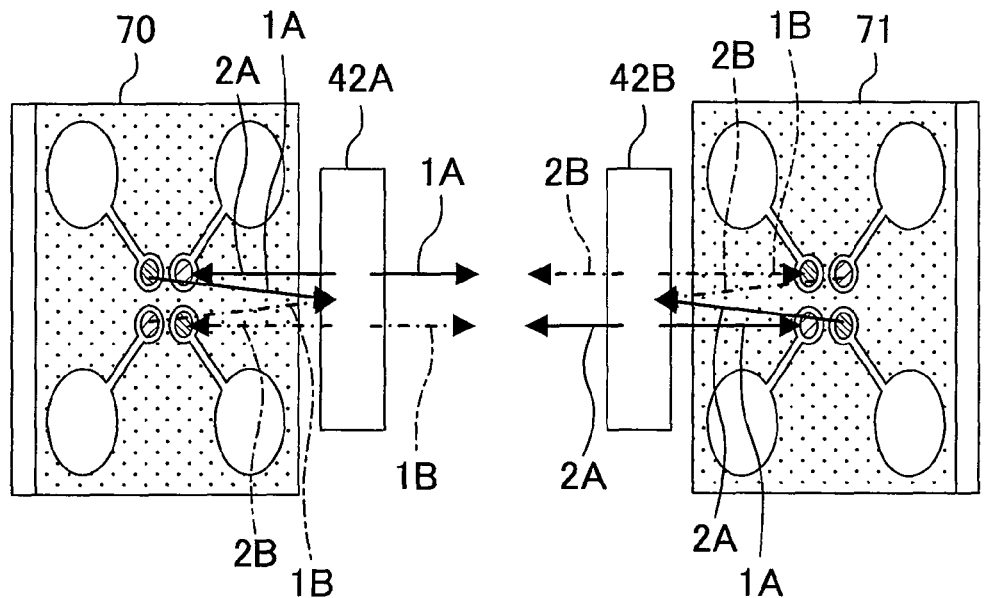
FIG. 13 is a diagram showing another exemplary optical communication system employing the optical transmission/reception device of the fourth embodiment of the present invention.
Figure 14:
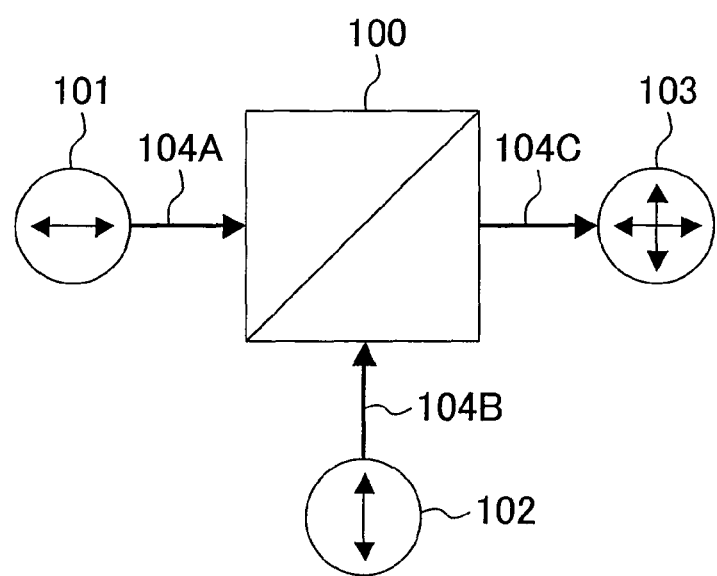
FIG. 14 is a diagram showing the concept of a conventional polarization multiplexing communication method.

FIG. 13 shows another exemplary optical communication system employing the optical transmission/reception device of this embodiment. As shown in FIG. 13, an optical transmission/reception device 70 according to this embodiment includes two light emitting portions for outputting horizontally-polarized waves (signal light 1A) and vertically-polarized waves (signal light 1B) through an optical element 42A and two light receiving portions for receiving horizontally-polarized waves (signal light 2A) and vertically-polarized waves (signal light 2B) through the optical element 42A. Another optical transmission/reception device 71 according to this embodiment includes two light emitting portions for outputting horizontally-polarized waves (signal light 2A) and vertically-polarized waves (signal light 2B) through an optical element 42B and two light receiving portions for receiving horizontally-polarized waves (signal light 1A) and vertically-polarized waves (signal light 1B) through the optical element 42B. The two optical transmission/reception devices 70 and 71 are arranged with a space being interposed therebetween. Specifically, in the optical communication system of FIG. 13, a signal can be transmitted through the space without using a transmission line, such as an optical fiber, an optical waveguide or the like. In the same optical transmission/reception device, a signal output from the light emitting portion for outputting horizontally-polarized waves and a signal output from the light emitting portion for outputting vertically-polarized waves have linear polarization directions orthogonal to each other, so that the signals do not interfere with each other even if they are transmitted in the same space. Also, in the same optical transmission/reception device, the light receiving portion for receiving horizontally-polarized waves and the light receiving portion for receiving vertically-polarized waves can receive only particular polarized waves without interference. Also, in each optical transmission/reception device, each light emitting portion and each light receiving portion are formed adjacent to each other. Therefore, axis adjustment between the two optical transmission/reception devices only needs to be performed once, so that cost of adjustment required for construction of an optical communication system can be significantly reduced. Further, if a time division communication technique, a wavelength division communication technique or the like is applied, similar polarization multiplexing information transmission can be bidirectionally performed. Thus, a highly-reliable bidirectional optical communication system can be achieved.

What is claimed is:

1. An optical transmission/reception device comprising:
   at least one light emitting portion; and
   at least one light receiving portion,
   wherein the light emitting portion and the light receiving portion are provided on the same substrate,
   the light emitting portion includes at least a lower multilayer reflector and an active layer provided on the lower multilayer reflector, and
   a first metal layer including a plurality of opening portions is provided in an upper portion of the light emitting portion, each of the plurality of opening portions having a size smaller than a light emission wavelength of the light emitting portion,
   wherein the plurality of opening portions of the first metal layer in the light emitting portion are arranged in a square grid pattern,
   a grid interval of the opening portions satisfies:

$$0.9 \times P \leq \lambda \times (i^2+j^2)^{1/2}(\in_1\in_2/\in_1+\in_2))^{1/2} \leq 1.1 \times P,$$

where P represents the grid interval of the opening portions, $\in_i$ represents a dielectric constant of the first metal layer, $\in_2$ represents a dielectric constant of a medium contacting an upper or lower surface of the first metal layer, λ represents the light emission wavelength of the light emitting portion, and i and j represent non-negative integers.

2. The optical transmission/reception device of claim 1, wherein a reflectance at an upper surface of the light emitting portion is higher than a reflectance at an upper surface of the light receiving portion.

3. The optical transmission/reception device of claim 1, wherein the lower multilayer reflector is provided in common in the light emitting portion and the light receiving portion.

4. The optical transmission/reception device of claim 3, wherein pits and projections are provided in a surface of the active layer in the light receiving portion.

5. The optical transmission/reception device of claim 1, wherein a second metal layer including a plurality of opening portions is provided in an upper portion of the light receiving portion, each of the plurality of opening portions having a size smaller than the light emission wavelength of the light emitting portion.

6. The optical transmission/reception device of claim 5, wherein the size of the opening portion of the second metal layer in the light receiving portion is larger than the size of the opening portion of the first metal layer in the light emitting portion.

7. The optical transmission/reception device of claim 5, wherein
the plurality of opening portions of the first metal layer in the light emitting portion are arranged in a rectangular grid pattern having two grid intervals different from each other and the plurality of opening portions of the second metal layer in the light receiving portion are arranged in a rectangular grid pattern having two grid intervals different from each other, and
a direction in which the plurality of opening portions of the first metal layer in the light emitting portion are arranged in the shorter grid intervals is different by 45 degrees or more from a direction in which the plurality of opening portions of the second metal layer in the light receiving portion are arranged in the shorter grid intervals.

8. The optical transmission/reception device of claim 5, wherein at least a portion of each of the first metal layer and the second metal layer is made of silver, gold, platinum, or aluminum.

9. The optical transmission/reception device of claim 5, wherein a reflectance of the first metal layer in the light emitting portion with respect to the light emission wavelength of the light emitting portion is higher than a reflectance of the second metal layer in the light receiving portion with respect to the light emission wavelength of the light emitting portion.

10. The optical transmission/reception device of claim 1, wherein an upper multilayer reflector is provided between the active layer and the first metal layer in the light emitting portion.

11. The optical transmission/reception device of claim 10, wherein the upper multilayer reflector is also provided in the light receiving portion.

12. The optical transmission/reception device of claim 11, wherein the number of layers of the upper multilayer reflector in the light emitting portion is larger than the number of layers of the upper multilayer reflector in the light receiving portion.

13. The optical transmission/reception device of claim 11, wherein pits and projections are provided in a surface of the upper multilayer reflector in the light receiving portion.

14. The optical transmission/reception device of claim 1, wherein the plurality of opening portions are arranged in cycles, the cycle being smaller than or equal to the light emission wavelength of the light emitting portion, in at least one direction of the grid pattern in which the plurality of opening portions of the first metal layer in the light emitting portion are arranged.

15. The optical transmission/reception device of claim 1, wherein the light emitting portion and the light receiving portion are provided within a region having a diameter of 150 μm or less on the substrate.

16. The optical transmission/reception device of claim 1, wherein the light receiving portion is provided, surrounding the light emitting portion.

17. The optical transmission/reception device of claim 1, wherein a light emission area of the light emitting portion is smaller than a light reception area of the light receiving portion.

18. An optical communication system, wherein
optical transmission/reception devices of claim 1 are employed,
the optical transmission/reception devices are provided at both ends of an optical fiber, and
a plurality of optical signals having different linear polarization directions are transmitted in the optical fiber.

19. The optical communication system of claim 18, wherein
each of the optical transmission/reception devices provided at both the ends of the optical fiber has a plurality of light emitting portions and a plurality of light receiving portions, and
the plurality of light emitting portions emit optical signals having linear polarization directions different from each other.

20. The optical communication system of claim 18, wherein the optical signal is a time division or wavelength division signal, and the signal is bidirectionally transmitted in the optical fiber.

21. The optical communication system of claim 18, wherein the optical fiber is a polarization maintaining optical fiber.

22. An optical communication system, wherein
a plurality of optical transmission/reception devices of claim 1 are employed, and
a plurality of optical signals having different linear polarization directions are transmitted via a space or an optical waveguide between the plurality of optical transmission/reception devices.

23. An optical transmission/reception device comprising:
at least one light emitting portion; and
at least one light receiving portion,
wherein the light emitting portion and the light receiving portion are provided on the same substrate,
the light emitting portion includes at least a lower multilayer reflector and an active layer provided on the lower multilayer reflector, and
a first metal layer including a plurality of opening portions is provided in an upper portion of the light emitting portion, each of the plurality of opening portions having a size smaller than a light emission wavelength of the light emitting portion,
wherein
the plurality of opening portions of the first metal layer in the light emitting portion are arranged in a rectangular grid pattern having two grid intervals different from each other,
the two grid intervals satisfy:

$$0.9 \times P_1 \leq \lambda \times (i^2+j^2)^{1/2}/(\in_1 \in_2/(\in_1+\in_2))^{1/2} \leq 1.1 \times P_1, \text{ and}$$

$$1.1 \times P_2 \geq \lambda \times (i^2+j^2)^{1/2}/(\in_1 \in_2/(\in_1+\in_2))^{1/2}$$

where $P_1$ represents the shorter one of the two grid intervals, $P_2$ represents the longer one of the two grid intervals, $\in_1$ represents a dielectric constant of the first metal layer, $\in_2$ represents a dielectric constant of a medium contacting an upper or lower surface of the first metal layer, $\lambda$ represents the light emission wavelength of the light emitting portion, and i and j represent non-negative integers.

24. The optical transmission/reception device of claim 23, wherein the plurality of opening portions are arranged in cycles, the cycle being smaller than or equal to the light emission wavelength of the light emitting portion, in at least one direction of the grid pattern in which the plurality of opening portions of the first metal layer in the light emitting portion are arranged.

* * * * *